United States Patent
Ishii et al.

(10) Patent No.: US 7,969,760 B2
(45) Date of Patent: Jun. 28, 2011

(54) SEMICONDUCTOR MEMORY DEVICE AND MANUFACTURING METHOD OF THE SAME

(75) Inventors: Tomoyuki Ishii, Kokubunji (JP);
Yoshitaka Sasago, Tachikawa (JP);
Hideaki Kurata, Kodaira (JP);
Toshiyuki Mine, Fussa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 810 days.

(21) Appl. No.: 11/790,590

(22) Filed: Apr. 26, 2007

(65) Prior Publication Data
US 2007/0285983 A1 Dec. 13, 2007

(30) Foreign Application Priority Data

May 10, 2006 (JP) ................................. 2006-131202

(51) Int. Cl.
*G11C 5/06* (2006.01)
(52) U.S. Cl. .................................... 365/63; 365/185.13
(58) Field of Classification Search .................... 365/63, 365/185.13
See application file for complete search history.

(56) References Cited

U.S. PATENT DOCUMENTS

| | | | | |
|---|---|---|---|---|
| 5,346,844 A | * | 9/1994 | Cho et al. | 438/253 |
| 6,849,502 B2 | | 2/2005 | Sasago et al. | 438/257 |
| 7,078,762 B2 | | 7/2006 | Ishii et al. | 257/316 |
| 7,244,984 B2 | | 7/2007 | Kamigaichi et al. | |
| 2005/0237842 A1 | * | 10/2005 | Takeuchi et al. | 365/225.7 |
| 2007/0224736 A1 | | 9/2007 | Kamigaichi et al. | |

FOREIGN PATENT DOCUMENTS

| JP | 8-55908 | 2/1996 |
|---|---|---|
| JP | 2004-31448 | 1/2004 |
| JP | 2005-56989 | 3/2005 |

\* cited by examiner

*Primary Examiner* — Huan Hoang
*Assistant Examiner* — Anthan T. Tran
(74) *Attorney, Agent, or Firm* — Miles & Stockbridge P.C.

(57) ABSTRACT

The invention provides a voltage applying structure having a reduced area penalty with respect to a data line. A wiring forming a global data line and a local data line formed in a p-type well region are connected via a select transistor. Two select lines are formed on a gate electrode of the select transistor. One select line is electrically connected to the gate electrode of the select transistor, however, the other select line is not connected to the select transistor. That is, an insulator film is formed between the select line and the gate electrode. As mentioned above, two select lines shorter than a gate length are provided on one select transistor. The select line is structured such as to be connected to the other select transistor.

10 Claims, 22 Drawing Sheets

SEMICONDUCTOR MEMORY DEVICE AND MANUFACTURING METHOD OF THE SAME

CROSS-REFERENCE TO RELATED APPLICATION

The present application claims priority from Japanese Patent Application No. JP 2006-131202 filed on May 10, 2006, the content of which is hereby incorporated by reference into this application.

TECHNICAL FIELD OF THE INVENTION

The present invention relates to a semiconductor memory device and a manufacturing technique of the same, and more particularly, to a technique effectively applied to a nonvolatile semiconductor memory device having a nonvolatile memory cell and a manufacturing of the same.

BACKGROUND OF THE INVENTION

As a semiconductor memory device for storing a data which is excellent in a portability, there has been widely used a flash memory corresponding to a nonvolatile memory. A cost per bit of the flash memory has rapidly come down year by year, and a falling degree is sharper than a falling degree which is expected only by reduction of memory cell size. This has been achieved by reducing an area per bit on the basis of an artifice of an element structure or an introduction of a multilevel storage. In the semiconductor memory device, an area of a memory cell is reflected on a chip area, thereby being reflected on a manufacturing cost of the semiconductor memory device. A rough standard of the cost can be grasped by calculating how many times $F^2$ a unit memory cell can be constructed, in which reference symbol F denotes a patterning dimension. At the present day, NAND type flash memory and AG-AND type flash memory can achieve a cell size which is approximately equal to a memory cell size corresponding to an ideally small $4F^2$. To make a memory cell smaller, it is necessary to line up the structure at a pitch smaller than 2F corresponding to twice of the lithography dimension F. To realize this, there can be considered such an artifice as to form a half pitch structure by utilizing a side wall of the once formed structure. As an example of the technique mentioned above, there can be listed up Japanese Patent Application Laid-Open Publication No. 08-055908 (Patent Document 1). And, there can be considered a technique of relaxing a pitch of a local data line (a local bit line) so as to connect to a global data line (a global bit line), however, in the case of relaxing the pitch of the local data line so as to connect to the global data line (the global bit line), it is necessary to set a select transistor to multi stages. As an example of a method of achieving a multi-stage select transistor with a small area penalty, there can be listed up Japanese Patent Application Laid-Open Publication No. 2004-31448 (Patent Document 2).

SUMMARY OF THE INVENTION

It is very important to reduce a memory cell size for achieving a high density of the semiconductor memory device. At the present, in order to further reduce a cell area of the flash memory achieving substantially an ideal cell size, there can be considered to use the patterning method described in the Patent Document 1 mentioned above. However, in the case of achieving a memory cell array structure having the lithograph dimension or less, even if the wiring pattern can be achieved by the artifice utilizing the side wall, there is still a problem remaining in the providing way of the plug with respect to word line or a data line. This is because, since the magnitude of the diameter of the plug is equal to or more than the pitch interval, the adjacent wirings are shorted if an alignment deviation of a photolithography step is taken into consideration. In the formation of the plug with respect to the word line, there can be considered a method of relaxing the pitch by utilizing both ends of the memory cell array, and it is possible to form the plug by extending a partial word line forward utilizing spaces in both ends.

However, with regard to the data line, since both of the NAND type and the AG-AND type have an array structure in which the memory cell array is divided into several pieces in a data line direction, the plug can not be provided by the same artifice as the word line. One reason of this is that the area penalty is enlarged if the plug is formed by the same artifice as the word line per the divided region, because it has a repeat structure divided into several pieces in the data line direction. And, there is another reason that the plug can not be formed in both sides by relaxing the pitch, because the select transistor is provided between the local data line and the global data line or between the local data line and the source line.

In this case, as a method of relaxing the pitch, there is considered a method of connecting a plurality of local data lines to a common global data line via the select transistor. However, it is hard to form the select transistor mentioned above for the reason mentioned below. It is necessary to select only one with respect to the adjacent local data lines, however, in the structure provided with two gate electrode lines, in the case of selectively use one gate electrode line, it is necessary to electrically short below the other gate electrode line. Generally, this can be achieved only by injecting an n-type impurity into a semiconductor substrate, however, because the local data lines are arranged at the pitch F, even if a resist pattern for injecting the impurity is formed in a minimum patterning dimension, the impurity is injected below the gate electrode line of the select transistor selecting the adjacent local data lines by taking the alignment displacement into consideration. Accordingly, it is impossible to select the adjacent local data line. Note that, Patent Document 1 has a description about the plug structure with respect to the word line, however, does not have a description about the plug structure with respect to the data line.

An object of the present invention is to provide a method of achieving a semiconductor memory device having a smaller pitch structure than a pitch determined on the basis of a line and a space of a used photolithography technique. Particularly, an object of the present invention is to provide a voltage applying structure having a less area penalty with respect to a data line.

The object mentioned above and the other objects and novel structures of the present invention will be apparent from the description in the specification and the accompanying drawings.

In the invention disclosed in the present application, an outline of a representative invention will be briefly described below.

A semiconductor memory device in accordance with this invention comprises (a) a local data line formed along a first direction, (b) a global data line formed on an upper layer of the local data line, and formed along the first direction, (c) a word line formed in a second direction which is vertical to the first direction, and (d) a charge accumulation portion formed in an intersecting region in which the local data line and the word line intersect in a plane manner. The semiconductor memory device stores an information on the basis of a change of an electric current flowing through the local data line, in correspondence to the charge accumulated in the charge accumulation portion. And, in the semiconductor device, a plurality of the local data lines is electrically connected to the one global data line. Further, a first global data line and a first local data line are connected via a first select transistor, the first global data line and a second local data line are connected via a second select transistor, a second global data line adjacent to the first global data line and a third local data line are connected via a third select transistor, the second global data line and a fourth local data line are connected via a fourth select transistor, the first select transistor has (g1) a first gate electrode formed on an upper layer of the first local data line, (g2) a first select line formed along the second direction, and formed on an upper layer of the first gate electrode, and (g3) a second select line formed along the second direction, and formed on an upper layer of the first gate electrode, the second select transistor has (h1) a second gate electrode formed on an upper layer of the second local data line, (h2) the first select line formed along the second direction, and formed on an upper layer of the second gate electrode, and (h3) the second select line formed along the second direction, and formed on the upper layer of the second gate electrode, the third select transistor has (i1) a third gate electrode formed on an upper layer of the third local data line, (i2) the first select line formed along the second direction, and formed on an upper layer of the third gate electrode, and (i3) the second select line formed along the second direction, and formed on the upper layer of the third gate electrode, the fourth select transistor has (j1) a fourth gate electrode formed on an upper layer of the fourth local data line, (j2) the first select line formed along the second direction, and formed on an upper layer of the fourth gate electrode, and (j3) the second select line formed along the second direction, and formed on the upper layer of the fourth gate electrode, the first select line and the first gate electrode are connected on the first local data line, the first select line and the fourth gate electrode are connected on the fourth local data line, the second select line and the second gate electrode are connected on the second local data line, and the second select line and the third gate electrode are connected on the third local data line.

Further, a manufacturing method of a semiconductor memory device in accordance with the present invention comprises (a) a step of forming a gate insulator film in a memory cell forming region and a select transistor forming region on a semiconductor substrate, (b) a step of forming a first conductor film on the gate insulator film, (c) a step of forming an insulator film on the first conductor film, (d) a step of forming a second conductor film on the insulator film, (e) a step of forming a control electrode in the memory cell forming region and forming a first select line and a second select line in the select transistor forming region, by patterning the second conductor film, (f) a step of patterning the insulator film and the first conductor film in the memory cell forming region, after forming a mask covering the select transistor forming region, and (g) a step of forming a charge accumulation film constituted by the first conductor film below the control electrode formed in the memory cell forming region via the insulator film, and forming a gate electrode constituted by the first conductor film in the select transistor forming region, in accordance with the step (f).

An effect obtained by the representative invention in the inventions disclosed by the present specification will be briefly described below.

Since a plurality of local data lines is structured to be electrically connected to the global data line, it is possible to reduce an area penalty. As a result, it is possible to achieve a high-density nonvolatile semiconductor memory device.

BRIEF DESCRIPTIONS OF THE DRAWINGS

DESCRIPTIONS OF THE PREFERRED EMBODIMENTS

Figure 1:
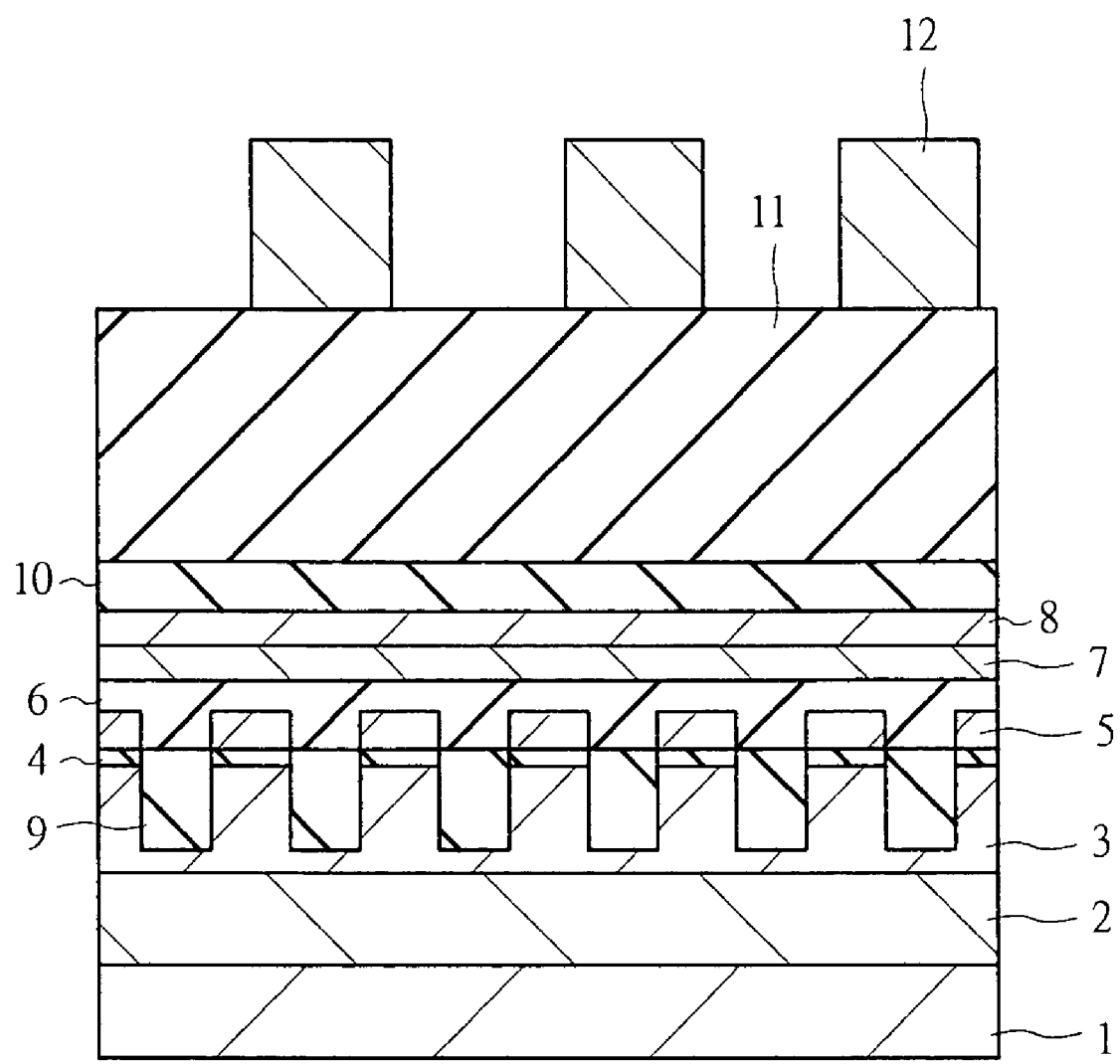
FIG. 1 is a cross sectional view of a main portion in a data line cross sectional direction of a memory cell array in accordance with an embodiment 1 of the present invention.

In the following embodiments, a description will be given by dividing into a plurality of sections or embodiments as occasion demands as a matter of convenience, however, the elements are not nothing to each other except a particularly clear description, but one is a modified example, details, a supplementary explanation or the like of a part or a whole of the other.

Further, in the following embodiment, in the case of referring to a number of elements (including a number, a numerical value, an amount, a range and the like), the present invention is not limited to the defined number except the case of the particular definition and the case of apparently limited to the specific number in principle, but may be equal to or more than the defined number or equal to or less than the defined number.

Further, in the following embodiments, it goes without saying that the constituting elements (including the element step and the like) is not necessarily essential except the case of the particular definition and the case of apparently essential in principle.

In the same manner, in the following embodiment, in the case of referring to a shape, a positional relation and the like of constituting elements, the present invention includes the shapes or the like substantially similar to the shape or the like except the case of the particular definition and the case of apparently seeming to be different therefrom in principle. This matter can be applied to the numerical value and the range mentioned above.

Further, in the drawings used in the present embodiment, there is a case that a hatching is applied even to a plan view for making the drawing be easily viewed. Further, in all of the drawings for explaining the present embodiment, the same reference symbols are attached to the same elements in principle, and a repeated description will be omitted. Further, in the case that it is necessary to differentiate even in the same function, different reference symbols are attached. A description of embodiments in accordance with the present invention will be given in detail below with reference to the accompanying drawings.

Embodiment 1

A description of a memory cell (a memory element) constructing a memory region of a nonvolatile semiconductor memory device in accordance with an embodiment 1 of the present invention will be given.

Figure 2:
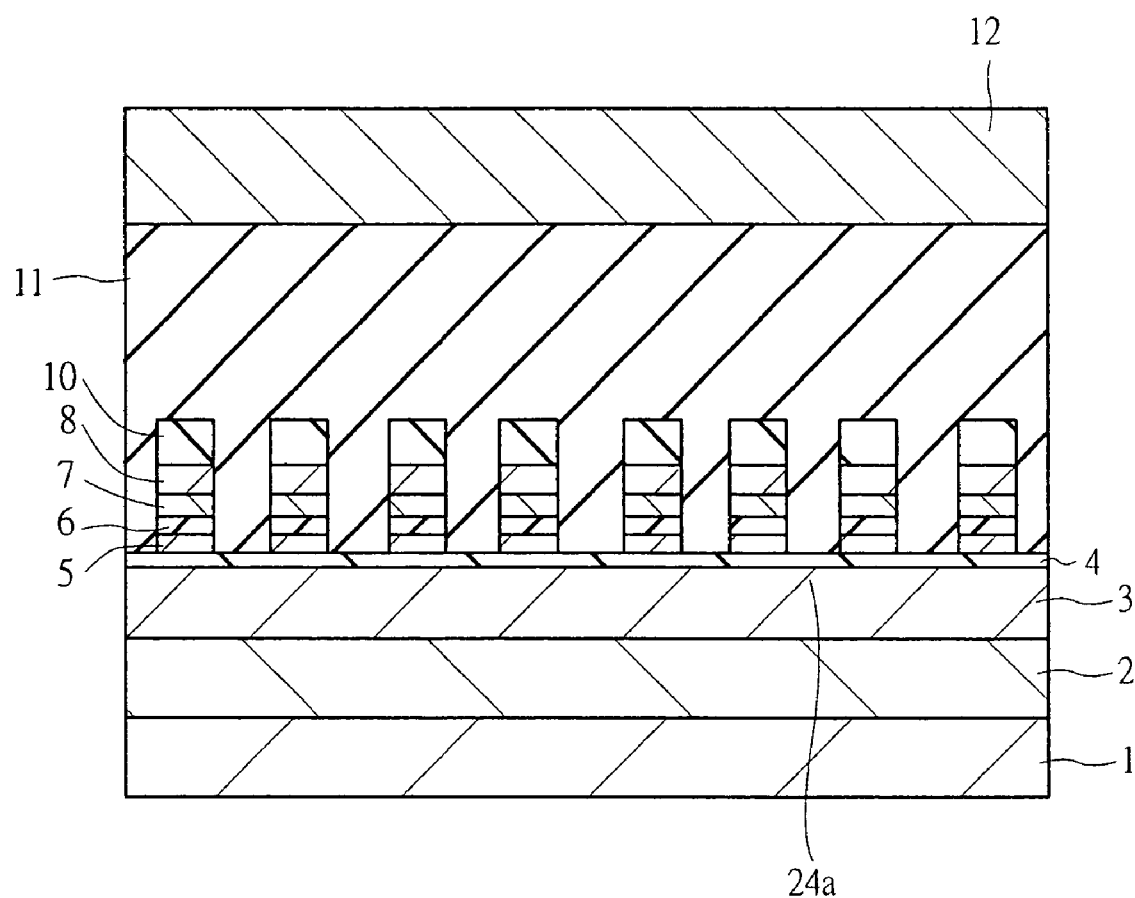
FIG. 2 is a cross sectional view of a main portion in a word line cross sectional direction of a memory cell array in accordance with the embodiment 1.

FIGS. 1 and 2 show a cross sectional view of a main portion of a memory cell array in accordance with the present embodiment 1. FIG. 1 is a view in a data line cross sectional direction, and FIG. 2 is a view in a word line cross sectional direction.

There is provided a ternary well structure in which an n-type well region 2 is provided in a p-type silicon substrate 1, and a p-type well region 3 is provided therein. A charge accumulation film 5 formed by an n-type polysilicon film is provided on a main surface of the silicon substrate 1, a control electrode formed by a stacked structure of an n-type polysilicon film 7 and a tungsten (W) film 8 is provided on an upper layer of the charge accumulation film 5, and the control electrode acts as a word line also. On the word line, there is a cap film 10 constituted by a silicon nitride film formed with a line width which is approximately equal to the word line. An interpoly dielectric film 11 is provided on the word line, and a wiring 12 made of an aluminum is provided thereon, and has a function of a global data line. The interpoly dielectric film and the structure of the wiring are provided in an upper portion therefrom, however, will be omitted for avoiding a complication in the light of an explanation of the structure of the memory cell array. In this case, the global data line is formed by a first layer of metal wiring, however, it is possible to employ a wiring in an upper layer.

A gate insulator film 4, for example, constituted by a silicon oxide film having a thickness of about 8 nm is provided between the charge accumulation film 5 and the silicon substrate 1, and a stacked film 6 is provided between the charge accumulation film 5 and the control electrode. The stacked film 6 is constituted, for example, by a silicon oxide film, a silicon nitride film and a silicon oxide film in which thicknesses are respectively about 5 nm, 8 nm and 5 nm.

An isolation region 9 is formed in the silicon substrate 1 in a direction vertical to the word line. The memory cell array is structured by repeating the structure mentioned above. In the present embodiment 1, the n-type impurity region is not particularly provided on a substrate surface 24a between the memory cells as is different from the conventional NAND type flash memory. In the present invention, it is possible to make an interval between the memory cells extremely narrow, and it is possible to control a voltage of the substrate surface between the memory cells by a fringe electric field from the charge accumulation film (the floating gate) 5 or the word line.

Since the n-type impurity region is not formed, the impurity does not spread, and there is obtained a feature that a short channel characteristic of the memory cell is improved. It is effective to achieve a low resistance by injecting the n-type impurity, for example, arsenic so as to decrease a concentration in spite of the p-type. Of course, the n-type impurity region may be formed as the conventional structure.

Figure 3:
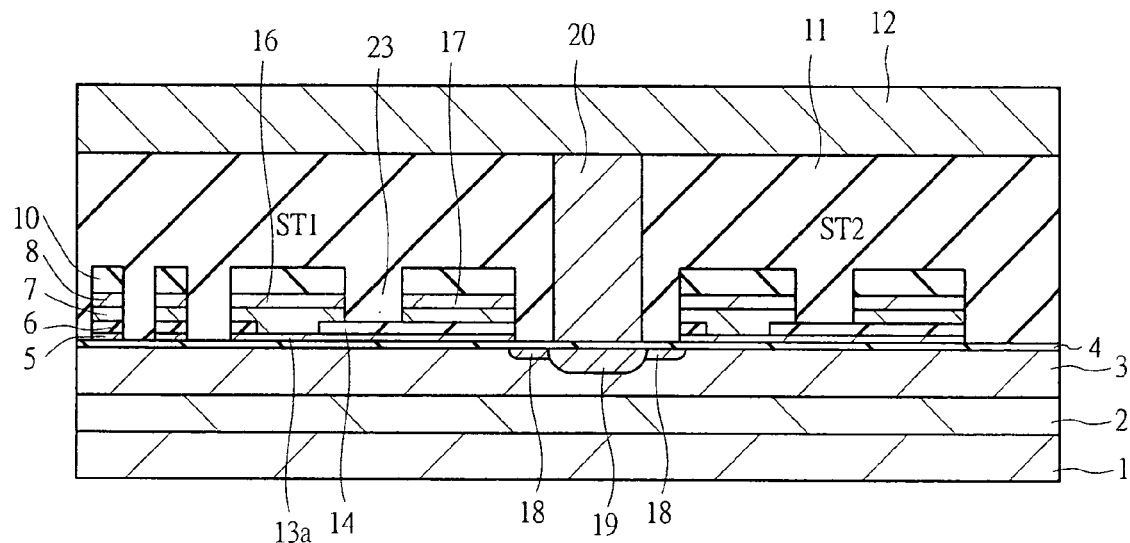
FIG. 3 is a cross sectional view of a main portion in the word line cross sectional direction of a select transistor in accordance with the embodiment 1.
Figure 4:
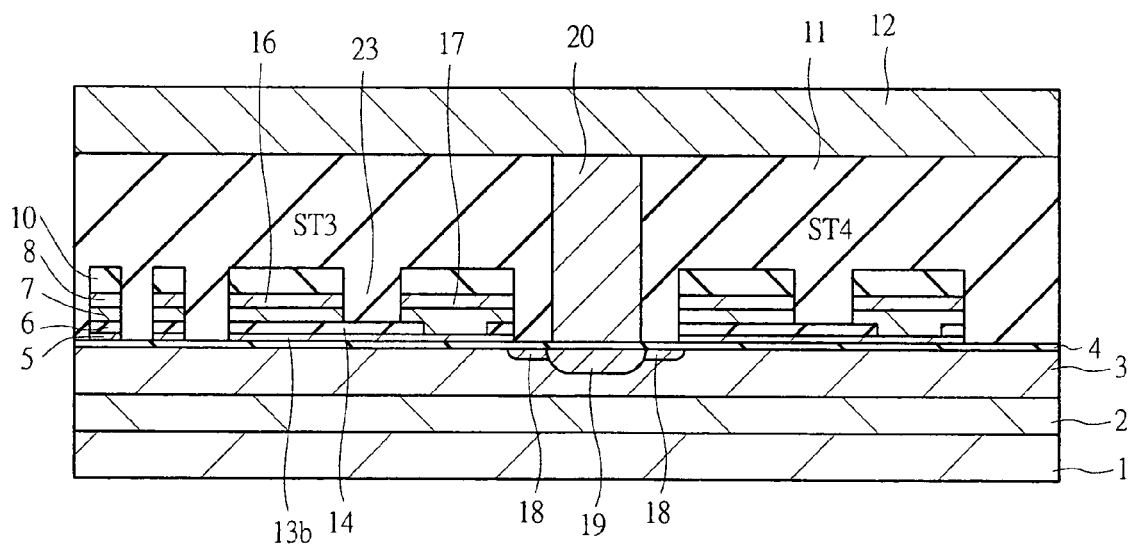
FIG. 4 is a cross sectional view of the main portion in the word line cross sectional direction of the select transistor in accordance with the embodiment 1.

FIGS. 3 and 4 show a cross sectional structure in a word line cross sectional direction of a select transistor portion for connecting the memory cell array and the global data line. The memory cell array is connected to the wiring (the global data line) 12 via the select transistor portion. A diffusion layer with double structure of a high-density n-type impurity region 19 and a low-density impurity region 18 is provided on a substrate surface of a plug 20, and high junction withstand voltage is realized. With respect to the plug 20 in the center of the drawing, a connection between the memory cell array in a left side and the global data line is controlled by a select transistor ST1 formed in a left side of the plug 20, and a connection between the memory cell array in a right side and the global data line is controlled by a select transistor ST2 in a right side of the plug 20.

Next, a description of a structure of the select transistor ST1, which is one of the features of the present invention, will be given. The select transistor ST1 in the present embodiment 1 has a gate electrode 13a on the gate insulator film 4, and a select line 16 and a select line 17 are formed on the gate electrode 13a via an insulator film 14. There is a feature in a point that two select lines 16 and 17 are provided in an upper portion of one gate electrode 13a constituted by the n-type polysilicon. In FIG. 3, a part of the insulator film 14 having the same structure as that of the interpoly dielectric film of the memory cell is removed, and the gate electrode 13a and the select line 16 are connected. On the other hand, in a cross section shown in FIG. 3, the insulator film 14 is formed between the gate electrode 13a and the select line 17, and the gate electrode 13a and the select line 17 are insulated. In FIG. 3, the select transistor ST1 is controlled by the select line 16 connected to the gate electrode 13a. In other words, a connection between a local data line formed in a lower portion of the gate electrode 13a and a global data line constituted by the wiring 12 via the plug 20 is controlled by applying a predetermined voltage to the select line 16. Here, the local data line is formed along a right side from a left side of a paper surface, within the p-type well region 3 below the gate electrode 13a. A plurality of local data lines is formed in such a manner as to be adjacent to each other (adjacent in a direction vertical to the paper surface). The select transistor ST1 is controlled by the select line 16, however, is insulated from the select line 17, therefore, the select line 17 is not used for controlling the select transistor ST1. However, the select line 17 is used for selecting the other select transistor ST3 which is adjacent to the select transistor ST1 (adjacent in the direction vertical to the paper surface).

FIG. 4 is a view showing a cross section of the select transistor ST3 which is adjacent to the select transistor ST1 shown in FIG. 3. In FIG. 4, with respect to the plug 20 in the center of the drawing, a connection between the memory cell array in a left side and the global data line is controlled by the select transistor ST3 formed in the left side of the plug 20, and a connection between the memory cell array in a right side and the global data line is controlled by a select transistor ST4 in a right side of the plug 20. In FIG. 4, the select transistor ST3 has a gate electrode 13b on the gate insulator film 4, and the select line 16 and the select line 17 are formed on the gate electrode 13b via the insulator film 14. There is a feature in a point that two select lines 16 and 17 are provided in an upper portion of one gate electrode 13b constituted by the n-type polysilicon. In FIG. 4, a part of the insulator film 14 having the same structure as that of the interpoly dielectric film of the memory cell is removed, and the gate electrode 13b and the select line 17 are connected. On the other hand, in a cross section shown in FIG. 4, the insulator film 14 is formed between the gate electrode 13b and the select line 16, and the gate electrode 13b and the select line 16 are insulated. In FIG. 4, the select transistor ST3 is controlled by the select line 17 connected to the gate electrode 13b. In accordance with this structure, the select transistor ST1 can be controlled by the select line 16, and the select transistor ST3 which is adjacent to the select transistor ST1 can be controlled by the select line 17. The gate electrodes 13a and 13b are arranged in such a manner as to be adjacent to each other, and are formed respectively on the selected local data lines with the same line width as the local data line. In other words, the gate electrodes 13a and 13b are arranged in such a manner as to be adjacent in the direction vertical to the paper surface. On the contrary, the select lines 16 and 17 are formed along the vertical direction to the paper surface, and have a common structure in the select transistors ST1 and ST3 which are adjacent in the direction vertical to the paper surface. There is a feature that the select line 16 and the select line 17 are not simultaneously connected.

As shown in FIG. 3, one end of the select lines 16 and 17 and end of the gate electrode 13a are approximately aligned with each other, and the gate electrode 13a is not disconnected in the other end of the select lines 16 and 17. In other words, an insulated region 23 in which none of the select lines 16 and 17 exists is formed in an upper portion of a part of the gate electrode 13a. Since two select lines 16 and 17 formed on the gate electrode 13a are away from each other, a gate length of the gate electrode 13a is larger than a length corresponding to a total of the widths of two select lines 16 and 17. Here, it is generally hard to make an operation voltage of the flash memory lower, therefore, there is a circumstance that the gate length of the select transistor can not so small in the light of securing the withstand voltage. In the present embodiment, the select transistor with the gate length of 0.8 μm is employed. Therefore, the length obtained by adding the widths of two select lines 16 and 17 becomes shorter than the gate length of the gate electrode 13a, taking into consideration a width of the insulator region 23 necessary for insulating with each other. Accordingly, in the case of employing the structure in accordance with the present invention, there is obtained a feature that an area penalty is hardly generated in spite of selecting the gate electrode 13a of the select transistor using two select lines 16 and 17. In other words, as shown in FIGS. 3 and 4, in the case that a plurality of local data lines (two local data lines in the present embodiment 1) is connected to one wiring 12 (the global data line), one local data line is selected, and the other local data line is not selected, therefore, two select transistors are necessary. Here, in FIG. 3, there can be considered that two select transistors are provided between the plug 20 connected to the global data line and the memory cell. In other words, there can be considered to form the select transistor in which the gate electrode extends in a direction orthogonal to the local data line, in multiple stages. In the case of the structure mentioned above, two select transistors are formed on one local data line, however, if one select transistor in two select transistors is structured such as to select a specific local data line, it is necessary to short the other select transistor formed on the specific local data line. In order to short, it is preferable to form the n-type impurity region below the gate electrode of the other select transistor. However, since the local data lines are arranged at the pitch F, the impurity is also injected to a portion below the gate electrode of the select transistor selecting the adjacent local data line by taking the alignment displacement into consideration, even if a resist pattern for injecting the impurity is formed at a minimum patterning dimension. Accordingly, it is impossible to select the adjacent local data line. As mentioned above, it is hard to achieve the structure in which two select transistors are provided on the specific local data line due to the problem in the impurity injection. Even if the structure is achieved, two select transistors with long gate length are formed between the plug 20 connected to the global data line and the memory cell, therefore, a very great area penalty is generated.

On the contrary, in the present embodiment 1, as shown in FIG. 3, only one select transistor is formed between the plug 20 connected to the global data line and the memory cell. Accordingly, it is possible to minimize the area penalty. In other words, since it is sufficient to secure a space at a gate length of one select transistor, it is possible to minimize the area penalty caused by the area for the select transistor.

This can be achieved by the matters shown below. As shown in FIG. 3, in the specific local data line, one select transistor ST1 is formed between the plug 20 connected to the global data line and the memory cell. And, the select transistor ST3 is formed on the other local data line which is adjacent to the local data line as shown in FIG. 4. The gate electrode 13*a* of the select transistor ST1 does not extend in the direction orthogonal to the local data line, but is formed at the same width as the line width of one local data line. Therefore, as shown in FIG. 3 and FIG. 4, the gate electrodes 13*a* and 13*b* are formed in a direction in which the local data lines are arranged (a direction vertical to the paper surface), and construct two select transistor ST1 and ST3. One local data line is selected from two adjacent local data lines connected to one global data line, by these two select transistor ST1 and ST3. As mentioned above, the gate electrodes 13*a* and 13*b* of the select transistors ST1 and ST3 themselves do not extend in the direction orthogonal to the local data line. The select lines 16 and 17 selecting the gate electrodes 13*a* and 13*b* extend in the direction orthogonal to the local data line.

It is necessary for the gate electrodes 13*a* and 13*b* to secure a comparatively long gate length for securing the withstand voltage. In other words, the gate electrodes 13*a* and 13*b* have a function of controlling a channel formation, and it is necessary to secure a comparatively long (about 1 μm) channel length for securing the withstand voltage. Accordingly, it is necessary to make the gate lengths of the gate electrodes 13*a* and 13*b* comparatively long. On the other hand, in order to apply a predetermined voltage to the gate electrodes 13*a* and 13*b* to control, the gate electrodes 13*a* and 13*b* are normally extended to act as select line also. However, the select line may be connected to the gate lines 13*a* and 13*b*, and is not necessarily set to the same width as the gate length. The present invention pays attention to this point, and has a feature in a point that the functions of the select lines are divided from the gate electrodes 13*a* and 13*b*, and the select lines 16 and 17 are individually provided. In other words, the select lines 16 and 17 are provided in such a manner as to be divided from the gate electrodes 13*a* and 13*b*. The select line 16 is structured such as to be connected to the gate electrode 13*a*, and is structured such as not to be connected to the gate electrode 13*b*. On the other hand, the select line 17 is structured such as to be connected to the gate electrode 13*b*, and is structured such as not to be connected to the gate electrode 13*a*. Accordingly, it is possible to independently and individually select the gate electrodes 13*a* and 13*b* by the select lines 16 and 17. Further, since it is not necessary to make the width of the select lines 16 and 17 equal to that of the gate electrodes 13*a* and 13*b*, it is possible to make the width of the select lines 16 and 17 small in comparison with the gate length of the gate electrodes 13*a* and 13*b* as shown in FIG. 3 and FIG. 4. Accordingly, since the width obtained by adding the widths of the select lines 16 and 17 can be made smaller in comparison with the gate length of the gate electrodes 13*a* and 13*b*, it is possible to set the area penalty of the area in which the select transistor is provided, to that of one select transistor, and it is possible to minimize the area penalty.

Figure 5:
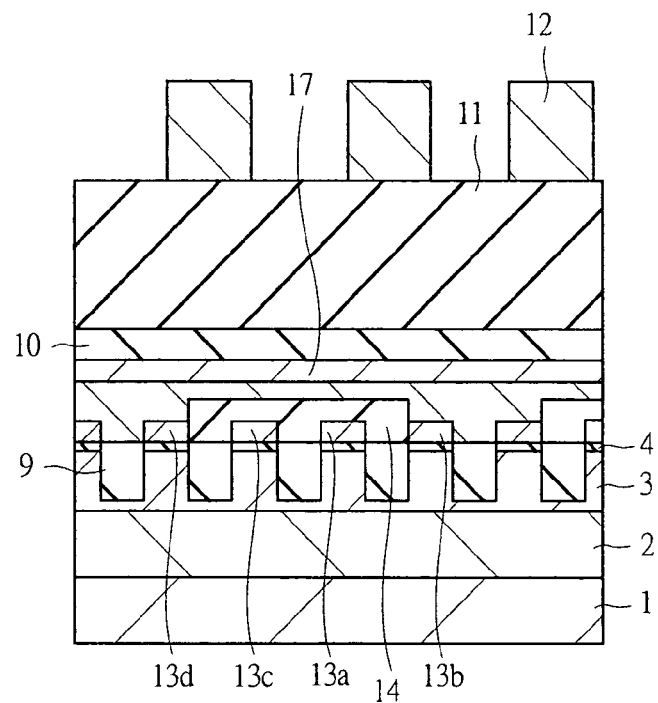
FIG. 5 is a cross sectional view of a main portion in the data line cross sectional direction of the select transistor in accordance with the embodiment 1.
Figure 6:
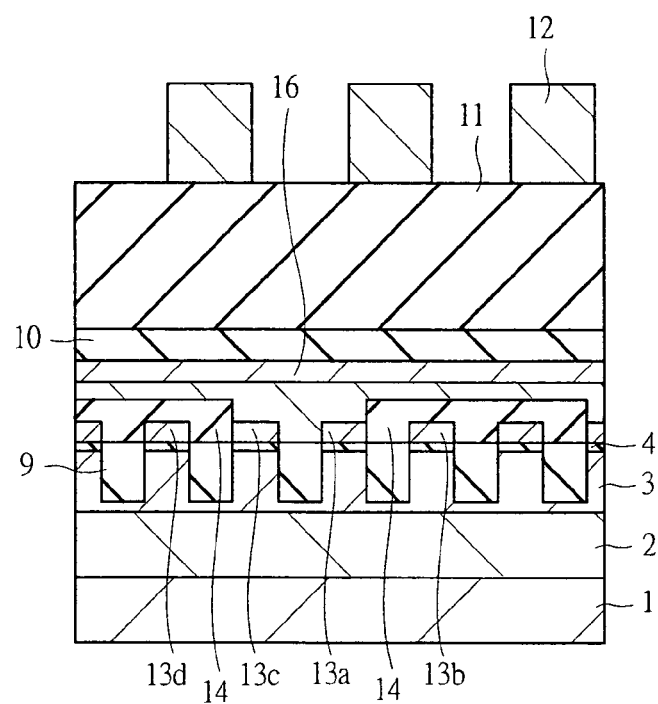
FIG. 6 is a cross sectional view of a main portion in the data line cross sectional direction of a select transistor in accordance with the embodiment 1.

Next, a cross sectional view in a data line cross sectional direction of the select transistor is shown in FIG. 5 and FIG. 6. FIG. 5 and FIG. 6 show the cross section of the same data line, and FIG. 5 corresponds to the cross section at the select line 17, and FIG. 6 corresponds to the cross section at the select line 16. A characteristic matter in the structure is that the insulator film 14 is removed in a continuous pattern with respect to two adjacent gate electrodes, and is connected to the select lines 16 and 17 made of the same material as the word line of the memory cell. Further, in two adjacent gate electrodes which are adjacent thereto, the gate electrodes and the select lines 16 and 17 are insulated by the insulator film 14 made of the same material as the insulator film 6 constituting the interpoly dielectric film of the memory cell.

In other words, in the cross section shown in FIG. 5, the adjacent gate electrode 13*b* and gate electrode 13*d* are connected to the select line 17. On the other hand, the insulator film 14 is formed on the gate electrode 13*a* and the gate electrode 13*c*, and the structure is made such that the gate electrodes 13*a* and 13*c* and the select line 17 are not connected. In the same manner, in the cross section shown in FIG. 6, the adjacent gate electrode 13*a* and gate electrode 13*c* are connected to the select line 16. On the other hand, the insulator film 14 is formed on the gate electrode 13*b* and the gate electrode 13*d*, and the structure is made such that the gate electrodes 13*b* and 13*d* and the select line 16 are not connected.

Here, with reference to FIG. 5, for example, the gate electrode 13*b* and the gate electrode 13*d* are connected to the same select line 17. Therefore, there is a concern that the local data line selected by the gate electrode 13*b* and the local data line selected by the gate electrode 13*d* are simultaneously selected. However, since the local data line selected by the gate electrode 13*b* and the local data line selected by the gate electrode 13*d* are connected to the different global data lines, they are not simultaneously selected. In FIG. 5, the local bit line selected by the gate electrode 13*b* is connected to the same global data line as the local data line selected by the gate electrode 13*a*. At this time, since the select line 17 is connected to the gate electrode 13*b*, but is not connected to the gate electrode 13*a*, two local data lines connected to the same global data line are not simultaneously selected.

In the present embodiment 1, the structure is made such that the select line is connected to two adjacent gate electrodes. By this structure, the effects described below can be obtained. In the present embodiment 1, a plurality of local data lines is formed at the pitch of the minimum patterning dimension F. Accordingly, the gate electrode of the select transistor formed on the local bit line is also formed at the pitch F. In this case, if the structure is made such that the select line connected to the gate electrode is connected per one gate electrode, it is necessary to form the plug connecting the select line and the gate electrode at the minimum patterning dimension F. However, since the alignment displacement is necessarily generated in the photolithography technique, there is a possibility that the position is deviated even if the plug is formed at the minimum patterning dimension. Accordingly, the plug is connected to the adjacent gate electrode also. Therefore in the present embodiment 1, the gate electrode and the select line are connected using one plug with respect to two adjacent gate electrodes. Accordingly, since there is generated a margin with respect to the alignment displacement for forming the plug, the short defect caused by the displacement can be prevented, and a reliability of the semiconductor memory device can be improved. As mentioned above, in accordance with the present embodiment 1, it is possible to reduce the chip size while improving the reliability of the semiconductor memory device.

Figure 7:
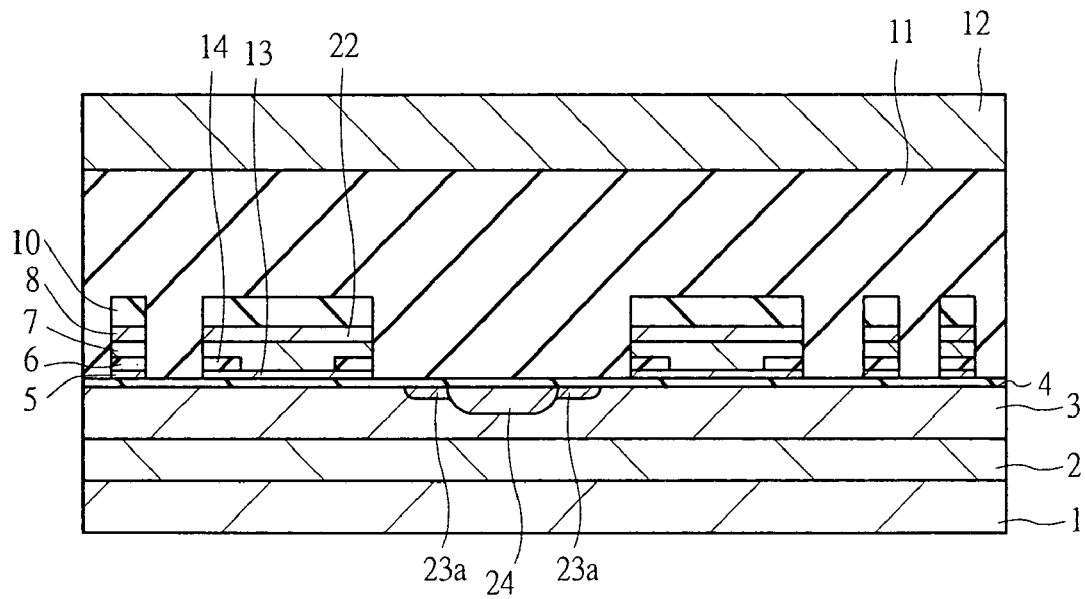
FIG. 7 is a cross sectional view in the word line cross sectional direction of a select transistor connecting a memory cell array and a source line, in the embodiment 1.

FIG. 7 shows a cross sectional view in the word line cross sectional direction of the select transistor connecting the memory cell array and the source line. A difference from FIG. 3 and FIG. 4 is that the number of the select line 22 of the select transistor is one. This is because the source line selects all the local data lines existing in one memory mat. The select line 22 of the select transistor is connected to the gate electrode 13. The diffusion layer is formed as the double structure constituted by the n-type low-density impurity region 23a and the n-type high-density impurity region 24 in the same manner as the voltage applied area of the local data line. Further, in the present embodiment 1, the source line is formed by a region constituted by the impurity region 24. Although an illustration is omitted, the plug is provided, for example, per 64 global data lines, and an electric current is applied to the source line. The current feed line is provided in a direction which is in parallel to the global data line. In accordance with the structure mentioned above, there is a feature that it is possible to reduce the layer number of the wiring.

Figure 8:
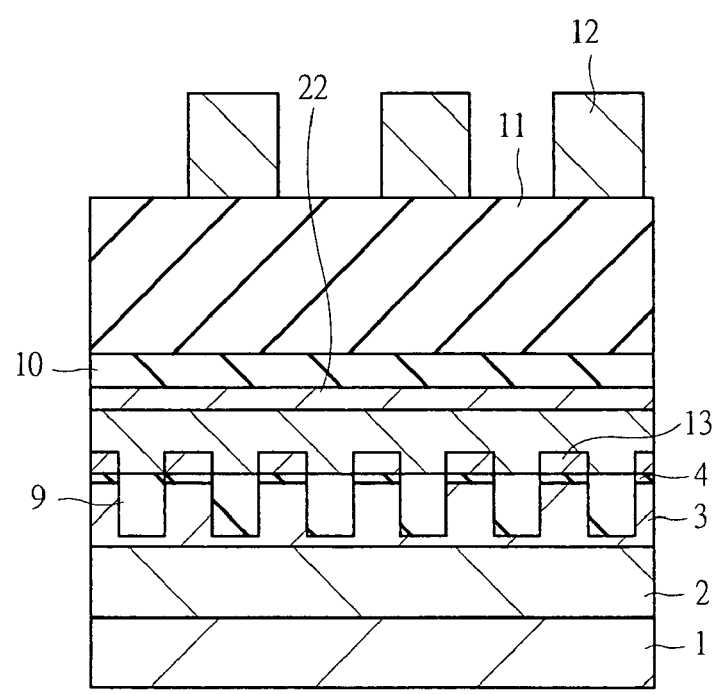
FIG. 8 is a cross sectional view in the data line cross sectional direction of a select transistor connecting a memory cell array and a source line, in the embodiment 1.

FIG. 8 shows a cross sectional view in the data line cross sectional direction of the select transistor connecting the memory cell array and the source line. The insulator film 14 (not shown) on the gate electrode 13 is removed in such a manner as to be frequently continuously astride between the local data lines, and the select line 22 and the gate electrode 13 are electrically connected. Accordingly, it is possible to select all the gate electrodes 13 selecting the individual local data lines by the select line 22.

Figure 9:
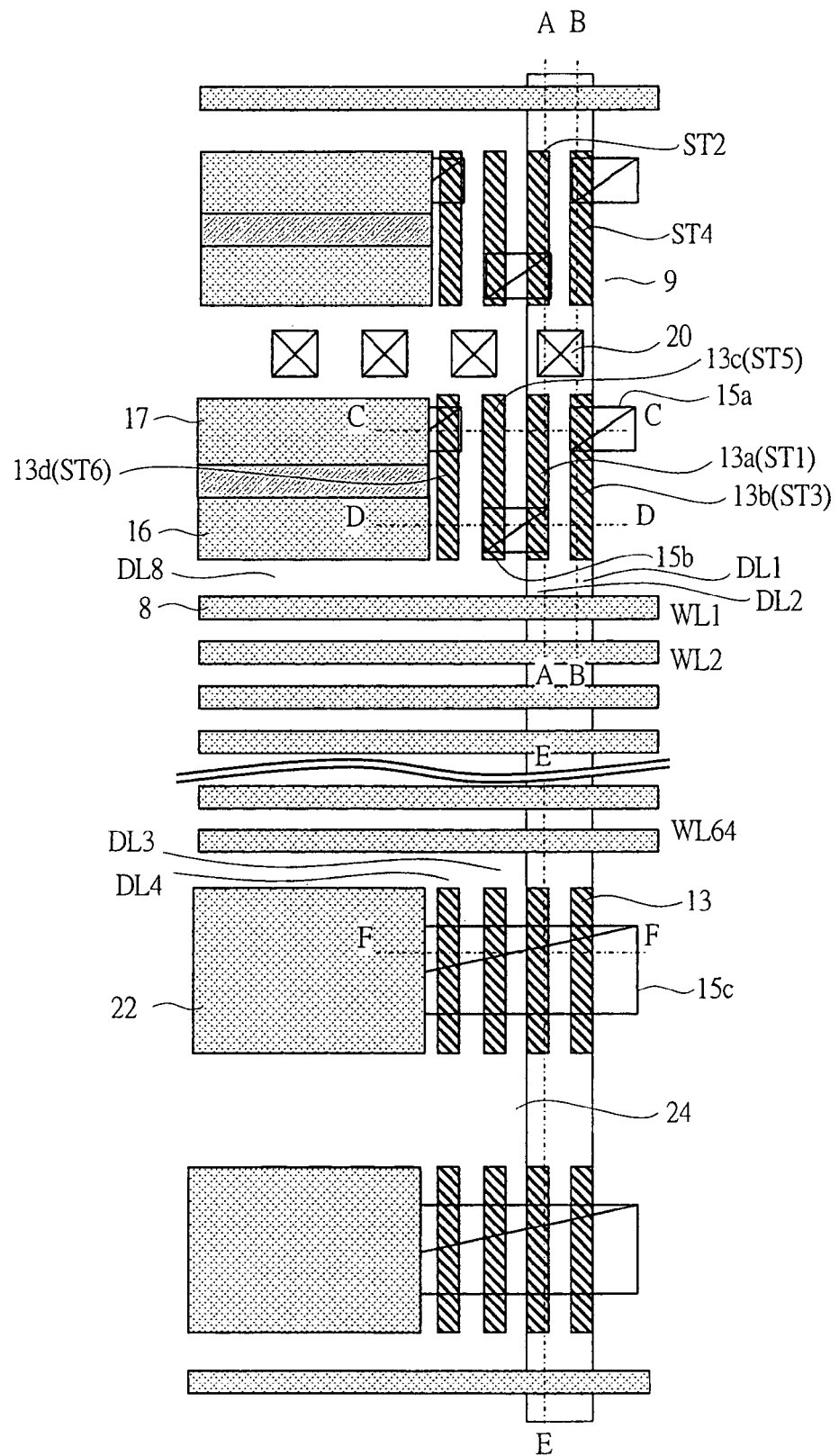
FIG. 9 is a plan view of a main portion of the memory cell array in accordance with the embodiment 1.
Figure 10:
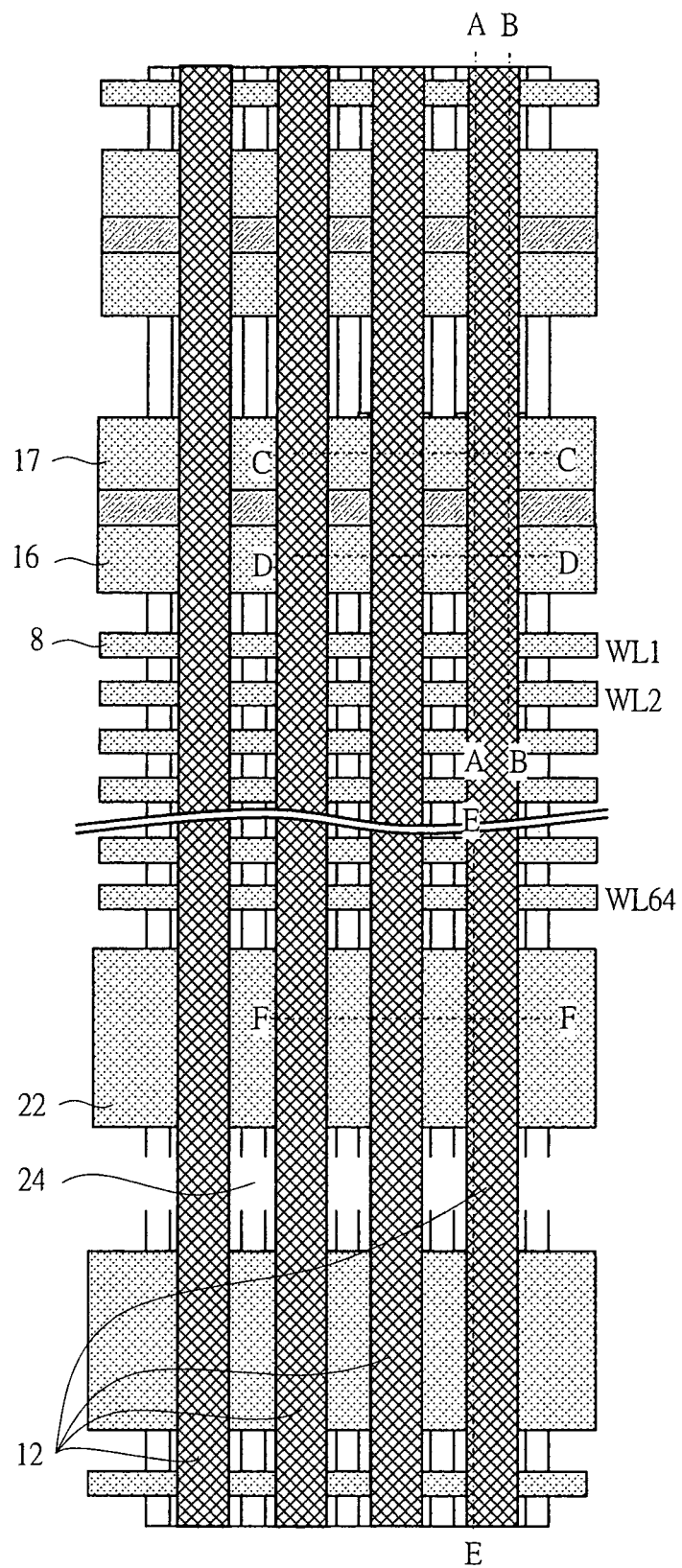
FIG. 10 is a plan view of a main portion of the memory cell array in accordance with the embodiment 1.
Figure 11:
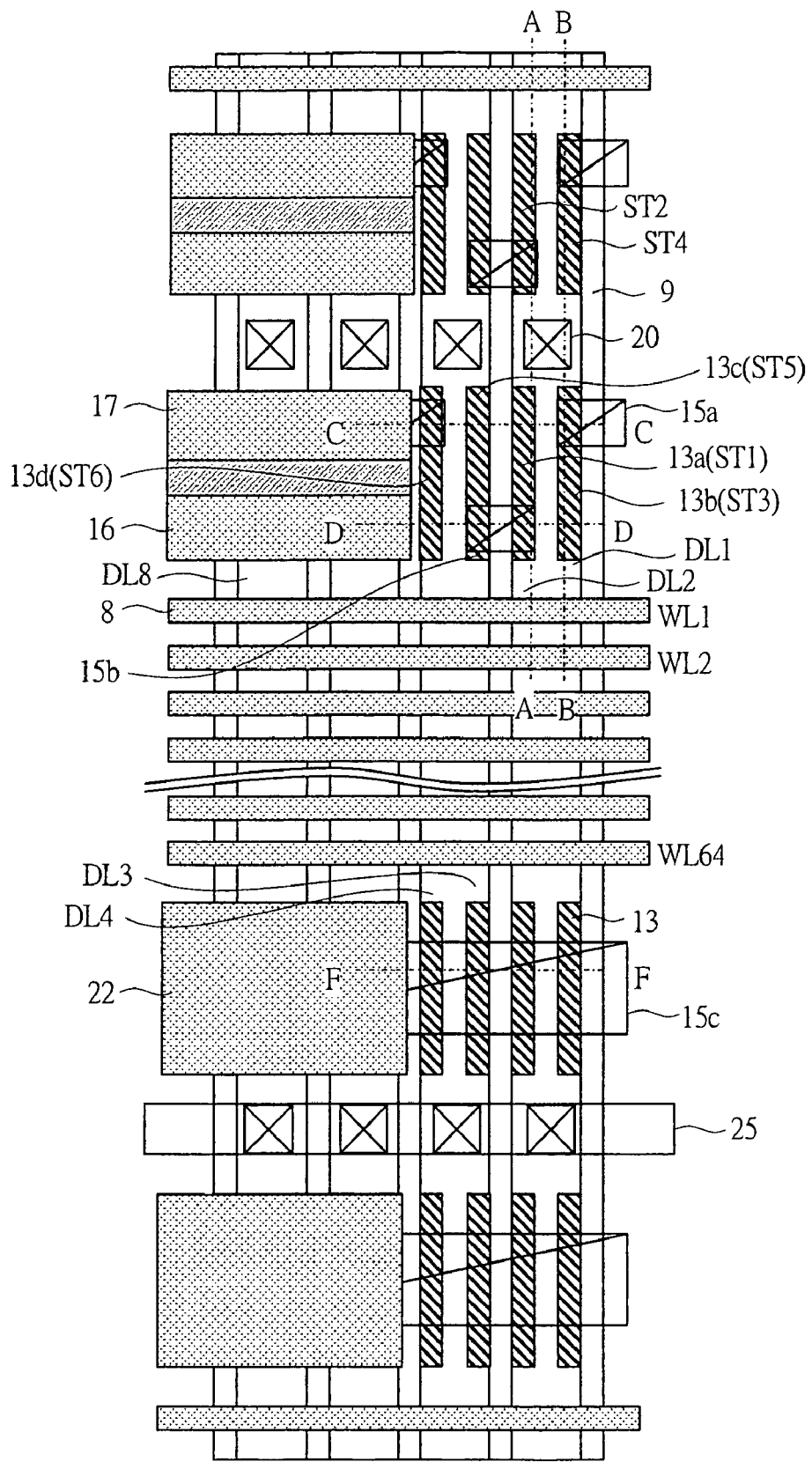
FIG. 11 is a plan view of a main portion of a memory cell array in accordance with a modified example of the embodiment 1.

FIG. 9 and FIG. 10 show a top view of the memory array structure. In order to explain a connecting relation between the gate electrode and the select line, FIG. 9 shows a structure before forming the global data line and in which the word line and the select lines 16, 17 and 22 are partly removed. FIG. 10 is a top view after forming the global data line. In the memory region of the nonvolatile semiconductor memory device in accordance with the present embodiment 1, a structure in which 64 word lines WL are repeated in one direction is set as a basic unit (hereinafter, refer to as a memory mat), and an element separation region and a silicon surface are repeated at an approximately uniform interval in a vertical direction to the one direction. The silicon portion is called as a local data line or a string. The local data line is connected to a wiring 12 constituting the global data line in one end of the memory mat. Two adjacent local data lines are connected to one global data line via the select transistor. The other end of the local data line is connected to the impurity region 24, which is the common source line, via the select transistor. In the memory cell array, the same structure is repeated over the whole of the memory mat. In regard to FIG. 9 and FIG. 10, a cross section along a line A-A corresponds to FIG. 3, a cross section along a line B-B corresponds to FIG. 4, a cross section along a line C-C corresponds to FIG. 5, a cross section along a line D-D corresponds to FIG. 6, a cross section along a line E-E corresponds to FIG. 7, and a cross section along a line F-F corresponds to FIG. 8, respectively. In this case, the impurity region (the diffusion layer wiring) 24 is used as the source line, however, the structure may be made, as shown in FIG. 11, such that the plug structure is provided, and the source line by the metal wiring 25 is provided. Since the resistance of the metal wiring 25 is low in comparison with the diffusion layer wiring, the metal wiring 25 has a feature that an influence by a voltage drop is small. In this case, since the source line by the metal wiring of the first layer is provided in the direction vertical to the global data line, the metal wiring of the second layer is used for the global data line.

A description will be further given in detail of a top surface structure of the memory cell array with reference to FIG. 9 and FIG. 10. As shown in FIG. 9, a plurality of local data lines LDs (LD1 to LD8) and the isolation region 9 are alternately formed in a first direction (a vertical direction of the paper surface) of the semiconductor substrate. And, the word lines WL (WL1 to WL64) are formed in a second direction which is perpendicular to the first direction. The local data line DL and the word line WL are formed at a pitch of the minimum patterning dimension F. The charge accumulation portion is formed in an intersecting region in which the word line WL and the local data line LD intersect in a plane manner. The current flowing through the local data line DL is changed in correspondence to the charge accumulated in the charge accumulation portion, whereby the nonvolatile semiconductor memory device stores the information.

In the present embodiment 1, there is a feature in a point that a plurality of local data lines DL is connected to one global data line. By this structure, the pitch of the global data line can be relaxed. For example, two local data lines DL1 and DL2 are connected to one global data line (the wiring 12 in FIG. 10) via the plug 20. At this time, the select transistor is formed in such a manner as to select respectively the local data lines DL1 and DL2 connected to one global data line. As shown in FIG. 9, the local data line DL1 is connected to the plug 20 connected to the global data line via the select transistor ST3. In the same manner, the local data line DL2 is connected to the plug 20 via the select transistor ST1. And, the local data line DL3 is connected to the adjacent different global data line via the select transistor ST5, and the local data line DL4 is connected to the global data line connected to the local data line DL3 via the select transistor ST6.

The select transistor ST1, ST3, ST5 and ST6 respectively have the gate electrodes 13a to 13d. The gate electrodes 13a to 13d are formed on the local data lines DL1 to DL4, and are formed at the same widths as those of the local data lines DL1 to DL4. And, the select line 16 and the select line 17 are formed commonly in the select transistors ST1, ST3, ST5 and ST6. The select line 16 is connected to the gate electrodes 13a and 13c via the plug 15b. On the other hand, the select line 17 is connected to the gate electrodes 13b and 13d via the plug 15a. The select lines 16 and 17 extend in the second direction.

Here, one of the features of the present invention is that the select line 16 and the select line 17 are formed smaller than the gate length of the gate electrodes 13a to 13d. In other words, the length obtained by adding the widths of the select line 16 and the select line 17 is smaller than the gate length of the gate electrodes 13a to 13d. As mentioned heretofore, by forming two select lines 16 and 17 on the gate electrodes 13a to 13d, even in the case where two select lines 16 and 17 are formed, the added width of the select line 16 and the select line 17 can be fitted to a range of the gate length of one select transistor ST1, ST3, ST5 or ST6, therefore, the area penalty of the select transistor can be minimized. And, this structure is achieved by forming the plug 15b connected to the select line 16 and the plug 15a connected to the select line 17 in a deviation manner. By this forming, the gate electrode 13a can be connected to the select line 16 via the plug 15b, and the gate electrode 13b can be connected to the select line 17 via the plug 15a. Therefore, the local data lines DL1 and DL2 connected to the same global data line can be selected independently and individually, by the select lines 16 and 17.

Further, one of the features of the present invention is that the select line 16 and the gate electrode 13a, and the select line 16 and the gate electrode 13c are integrally connected by one plug 15b. Accordingly, the gate electrode 13a and the gate electrode 13c are selected together by the select line 16, however, since the global data line connected to the local data line DL2 by the select transistor ST1 is different from the global data line connected to the local data line DL3 by the select transistor ST5, the local data lines connected to the same global data line are not simultaneously selected. Since the select line 16 and the gate electrode 13a, and the select line 16 and the gate electrode 13c are integrally connected by one plug 15b, the effect shown below can be obtained. The pitch of the local data line DL and the gate electrodes 13a to 13d is formed at the minimum patterning dimension F, however, the plug 15b can be patterned at a dimension connecting two gate electrodes 13a and 13c, therefore, it is possible to have a margin of the alignment deviation. In other words, the pitch width of the local data line DL is smaller than the diameter of the plug 20 connecting the local data line DL and the global data line. Furthermore, since the pitch width of the word line WL is formed also at the minimum patterning dimension F, it can be said that the pitch width of the word line WL is smaller than the diameter of the plug 20 connecting the local data line DL and the global data line. In accordance with the matter mentioned above, it is not necessary to form the plug 15b strictly, as a result, it is possible to achieve an improvement of yield ratio at the manufacturing step of the semiconductor memory device.

Next, in the memory cell array structure in the present embodiment 1, the source line constituted by the impurity region 24 extending in the second direction is formed. And, the select transistor selecting the source line between the impurity region 24 and the word line WL is formed on the local data line DL. In other words, the gate electrode 13 is formed on each of the local data lines, and the gate electrode 13 is connected to the select line 22 extending in the second direction via the plug 15c.

Figure 12:
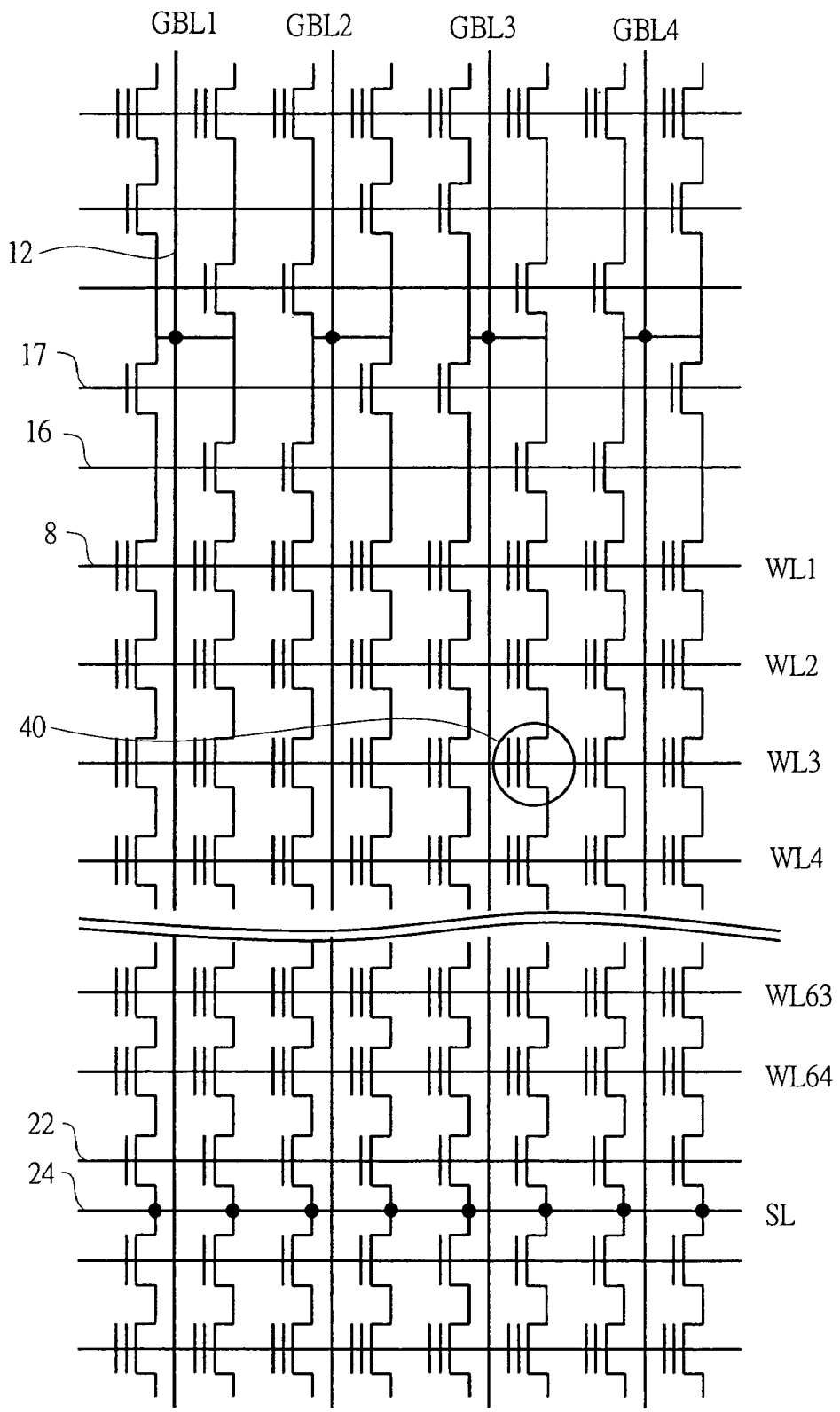
FIG. 12 is an equivalent circuit diagram of the memory cell array in accordance with the embodiment 1.
Figure 13:
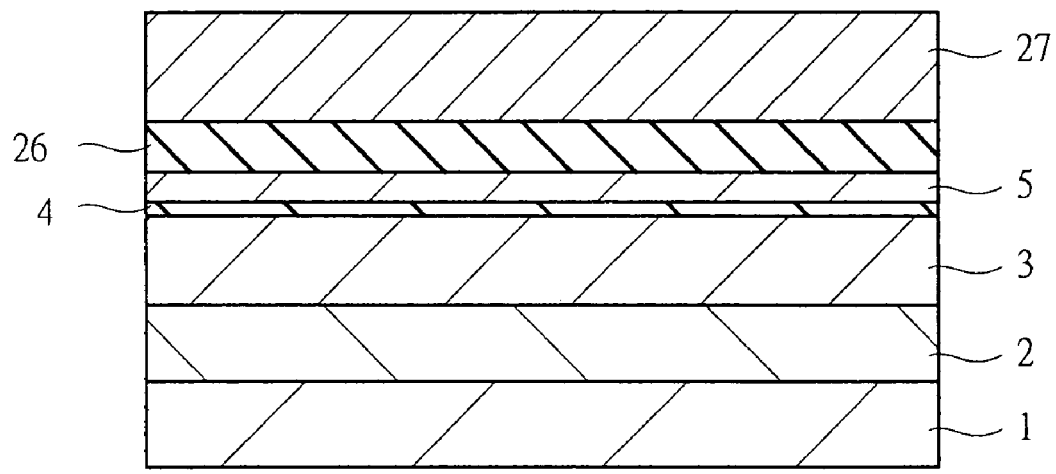
FIG. 13 is a cross sectional view of a main portion in the data line cross sectional direction for explaining a manufacturing step of the memory cell array in accordance with the embodiment 1.

Next, FIG. 12 shows a circuit diagram which is equivalent to FIG. 10. An operation will be explained using the equivalent circuit diagram in FIG. 12. The description will be given by setting the target cell to a memory cell 40 selected by the global data line GBL3, the select line 16 and the word line WL3.

Firstly, a description of a read operation will be given. The global data line GBL3 is set to 1V, the source line SL is set to 0V, and the select line 16 and the select line 22 are selected (1V). The select line 17 is set to be unselected (0V). Further, the word line WL3 is selected by setting to 0.5V. The unselected word lines WL1, WL2 and WL4 to WL64 are set to 4V, and the corresponding memory cell is set to a low resistance state. As a result, if a number of electron accumulated in the charge accumulation film 5 of the select cell is large, a high resistance is generated, and if it is small, a low resistance is generated, therefore, the read operation can be executed utilizing a difference of a speed at which the voltage of the global data line GBL3 is changed.

Next, a description of a program operation will be given. First, the source line SL is previously charged at 4.5V, and the local data line is previously charged by selecting the select line 22. Further, the global data line GBL3 is set to a predetermined voltage corresponding to information to be programmed in the memory cell 40. In this case, it is set to 0V or 1V. After setting the select line 22 to the unselected state, the select line 16 is selected by applying 1V. The select line 17 is kept in the unselected state. Accordingly, if the set voltage of the global data line GBL3 is high (1V), the select transistor is not turned on, therefore, the substrate surface of the memory cell 40 comes to a high voltage such as about 4.5V.

On the other hand, if the set voltage of the global data line GBL3 is low (0V), the select transistor is turned on, the voltage of the previously charged local data line is lowered, and the substrate surface of the memory cell 40 comes to a low voltage such as about 0V.

Thereafter, the voltage of the corresponding word line WL3 is increased to 18V. At this time, the unselected word lines WL1, WL2 and WL4 to WL64 are set to 10V. At this time, if the voltage of the substrate surface is high, the voltage difference from the charge accumulation film 5 is small, therefore, a tunnel current flowing through the gate insulator film 4 is small. If the voltage of the substrate surface is low, the voltage difference from the charge accumulation film 5 is large, therefore, the large tunnel current flows through the gate insulator film 4, and a lot of electrons are injected to the charge accumulation film 5.

Thereafter, by executing the read operation, it is verified whether desired information is programmed or not. As occasion demands, the program operation is again executed with respect to only the memory cell in which the program is not executed sufficiently. By repeating the program and the verifying operation, the desired information is programmed reliably.

An erase operation is executed collectively with respect to the memory mat. The information is erased by applying a predetermined positive voltage (2V) to the p-type well region 3, applying a negative large voltage (−18V) to the word lines WL1 to WL64, and drawing out the electron on the substrate.

In above description, in order to simply describe, the operation of programming 1 bit information with respect to one cell is employed, however, it is possible to form a lot of states by adjusting an amount of the injected electrons. For example, if four levels are prepared, 2 bit information can be stored. In this case, information is read using three kinds of word line voltages in the read operation.

In the present invention, in the light of the connecting relation between the local data line and the global data line, if the adjacent global data lines are simultaneously programmed, an operation of simultaneously programming the memory cells connected to the adjacent local data lines is executed. Since the operation mentioned above can be executed, and a lot of memory cells can be selected simultaneously, it is possible to achieve a good programming throughput.

Further, as an operation in which the influence from the adjacent local data line is smaller, an operation using alternating global data lines at programming is effective. In the present invention, it is possible to make the interval between the local data lines half of the used photolithography technique. However, as a result, an electrostatic capacity coupling between the adjacent local data lines is enlarged, and the influence of the voltage of the adjacent local data lines largely affects. In the operation using the alternating global data lines, it is necessarily possible to avoid the simultaneous program with respect to the adjacent local data lines.

Further, the global data line is arranged at the minimum pitch of the used photolithography technique. As a result, a capacity coupling between the global data lines becomes very large. This is because the local data lines are arranged in parallel at the length of one mat, but the global data lines are arranged in parallel at the length of the whole of the memory cell array. Therefore, by operation using the alternating global data lines, the global data lines which are not operated can be used as shield between the operating global data lines. These matters are not limited to the program operation, but can be applied to the read operation. In other words, at the reading operation, it is possible to execute a stable read operation by reading the information of the local data lines connected to the alternating global data lines simultaneously.

Next, a description of a manufacturing step of the memory region of the nonvolatile semiconductor memory device in accordance with the present embodiment 1 will be given with reference to FIG. 13 to FIG. 27. Since FIG. 13 to FIG. 20 show a forming step of the local bit line and the floating gate electrode, these drawings show cross sectional views in a local bit line cross sectional direction. Since the thereafter steps correspond to a word line forming step, FIG. 21 to FIG. 27 are cross sectional views in a word line cross sectional direction. In the word line cross section, there is shown a cross sectional view including the voltage applied area to the global bit line.

First, the p-type silicon substrate 1 is prepared. After an isolation region for a peripheral circuit is formed in a predetermined region on a main surface of the silicon substrate 1, a deep n-type well region 2 is formed, and a p-type well region 3 is further formed. At this time, the isolation region is not formed in the memory cell array portion.

Next, after executing an ion implantation for adjusting a threshold voltage of a high voltage transistor (a peripheral circuit), a p-type impurity, for example, a boron (B) is ion implanted to the memory region for adjusting the threshold voltage. After forming a gate insulator film having a thickness of about 20 nm for the high voltage transistor, the gate insulator film formed on the surface of the memory region and the normal voltage transistor forming region is removed using the resist pattern as a mask.

Thereafter, the surface of the silicon substrate 1 is oxidized again, and the gate insulator film 4 constituted by a silicon oxide film having a thickness of about 8 nm is formed. Further, an n-type amorphous silicon film for the charge accumulation film 5, and a silicon nitrogen (SiN) film 26 for forming a dummy pattern are accumulated.

Here, anneal is executed and the amorphous silicon film is crystallized. By accumulating with the amorphous and crystallizing thereafter, a uniformity of a film thickness can be secured. Thereafter, a polysilicon film 27 for forming the dummy pattern is accumulated (FIG. 13), and a resist pattern having a minimum pitch (2F) is formed by photolithography technique using the resist film. Further, the line width is narrowed by ashing the resist film by an oxygen plasma. The line width is set to about one quarter of the pitch, that is, about F/2.

Figure 14:
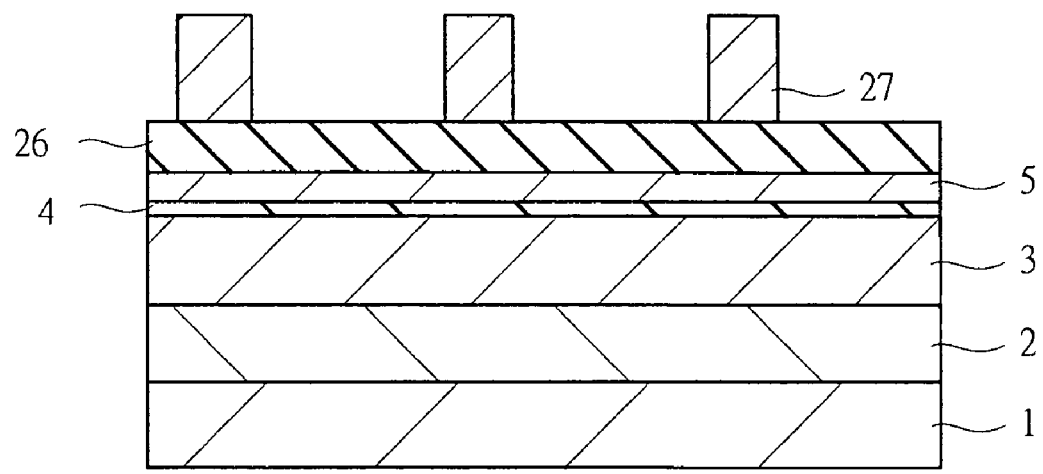
FIG. 14 is a cross sectional view of a main portion in the data line cross sectional direction for explaining the manufacturing step of the memory cell array coming next to FIG. 13.
Figure 15:
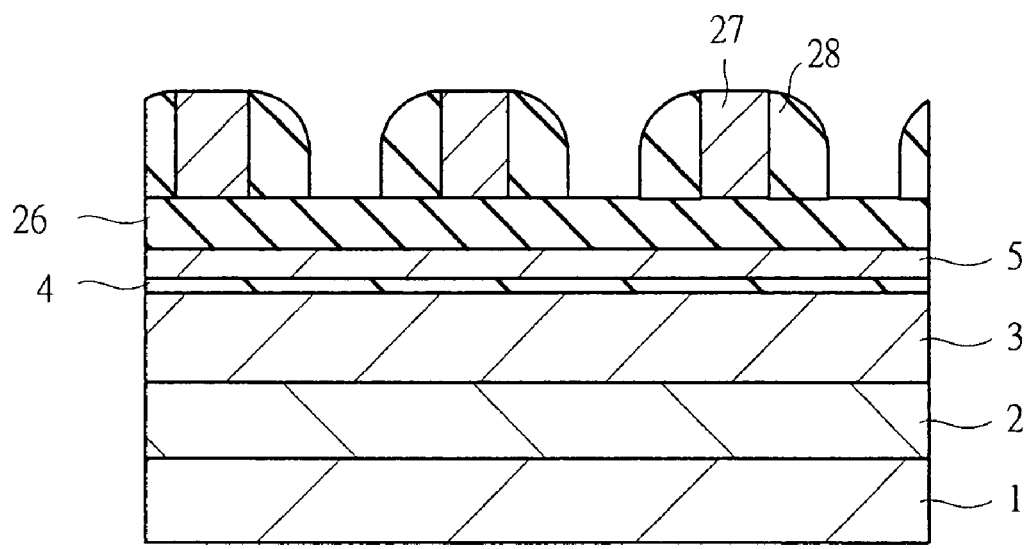
FIG. 15 is a cross sectional view of the main portion in the data line cross sectional direction for explaining the manufacturing step of the memory cell array coming next to FIG. 14.
Figure 16:
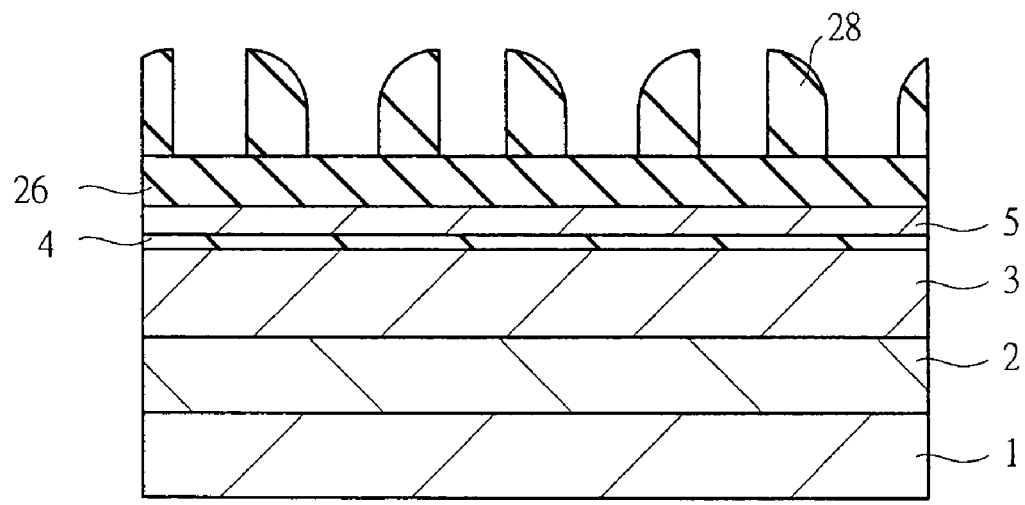
FIG. 16 is a cross sectional view of the main portion in the data line cross sectional direction for explaining the manufacturing step of the memory cell array coming next to FIG. 15.

The top polysilicon film 27 is etched using the resist pattern as a mask, and the resist film is removed (FIG. 14). Thereafter, the silicon oxide film having a film thickness of about F/2 is accumulated by chemical vapor deposition (CVD) method, and a side wall 28 is formed with respect to the polysilicon film 27 by etching back (FIG. 15). Further, the polysilicon film is accumulated, thereafter, only the side wall 28 constituted by a silicon oxide film is left by etching (FIG. 16). At this time, the structure of the side wall 28 is formed by a half pitch of the structure formed by the polysilicon film 27, that is, the pitch F.

Figure 17:
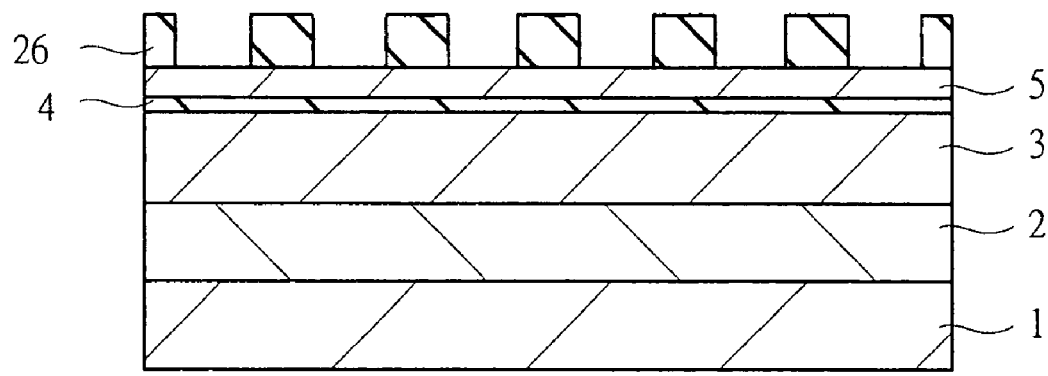
FIG. 17 is a cross sectional view of the main portion in the data line cross sectional direction for explaining the manufacturing step of the memory cell array coming next to FIG. 16.
Figure 18:
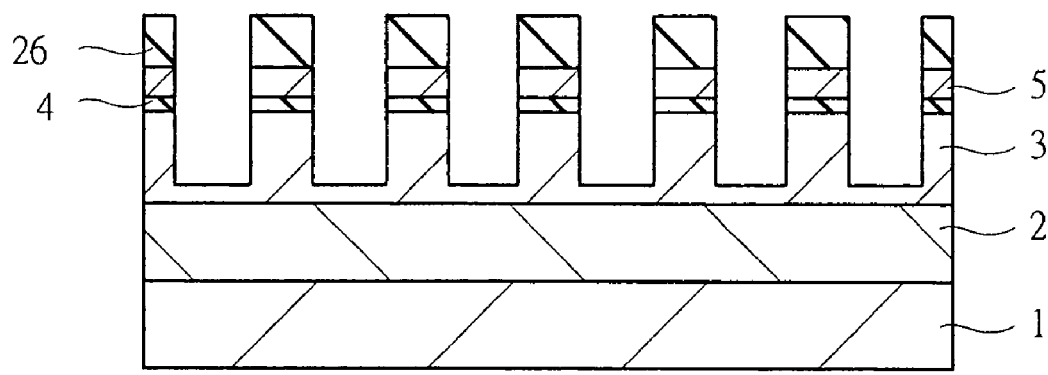
FIG. 18 is a cross sectional view of the main portion in the data line cross sectional direction for explaining the manufacturing step of the memory cell array coming next to FIG. 17.

The silicon nitride film 26 is dry etched using the side wall 28 constituted by the silicon oxide film as a mask, and the side wall 28 is removed by a hydrofluoric acid (FIG. 17). Thereafter, the charge accumulation film (a floating gate electrode) 5, which is a lower layer structure, the gate insulator film 4 and the p-type well region of the silicon substrate 1 are etched by using the silicon nitrogen film 26 as a mask (FIG. 18). As mentioned above, an isolation groove is formed in a self-aligned manner with respect to the charge accumulation film (the floating gate electrode) 5. At this time, the gate electrode 13 (not shown) of the select transistor is also formed at the same width as the local data line, and the isolation groove is formed in a self-aligned manner. In other words, the gate electrodes 13a to 13d of the select transistor are formed by the same film as the polysilicon film forming the charge accumulation film 5. In other words, the polysilicon film becomes the charge accumulation film 5 in the memory region, and becomes the gate electrodes 13a to 13d in the select transistor forming region.

Figure 19:
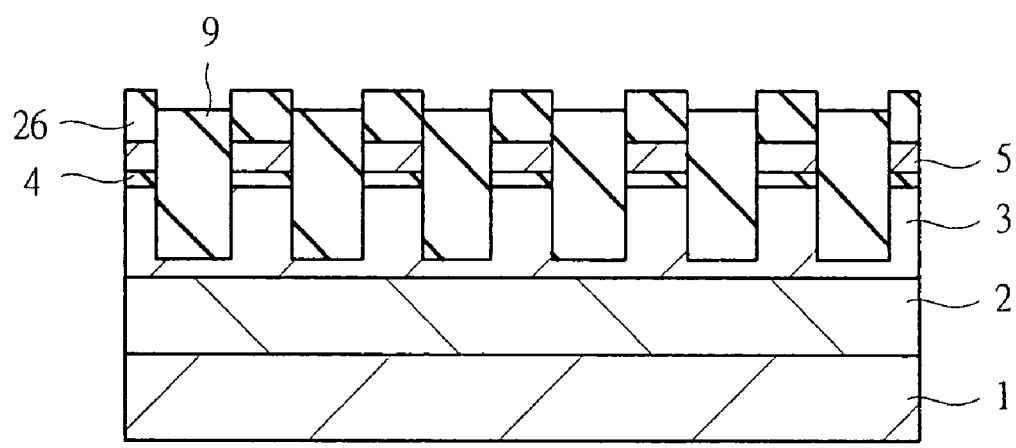
FIG. 19 is a cross sectional view of the main portion in the data line cross sectional direction for explaining the manufacturing step of the memory cell array coming next to FIG. 18.

Thereafter, the silicon oxide film is accumulated by the chemical vapor deposition (CVD) method, and is flattened by chemical mechanical polishing (CMP) method (FIG. 19). Accordingly, the silicon oxide film is embedded in the isolation groove, and the isolation region 9 is formed.

Figure 20:
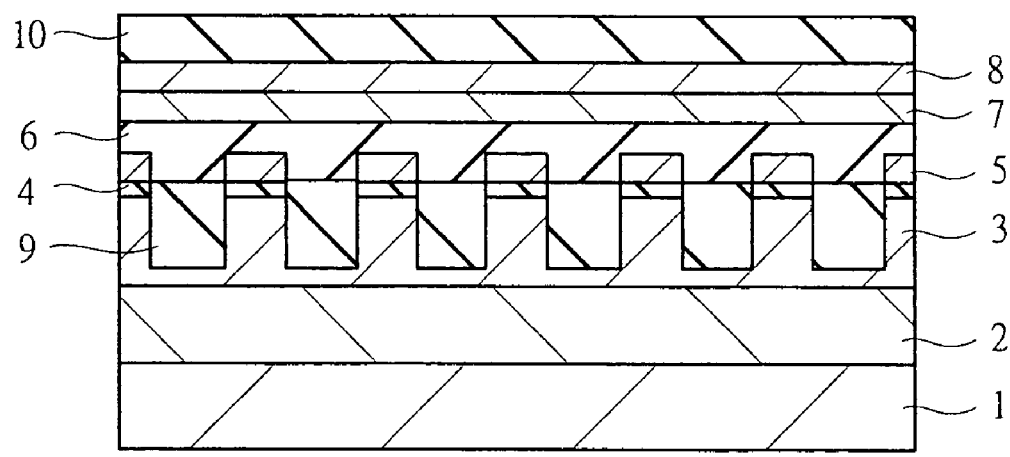
FIG. 20 is a cross sectional view of the main portion in the data line cross sectional direction for explaining the manufacturing step of the memory cell array coming next to FIG. 19.

Next, after etching back of the silicon oxide film and removing the silicon nitride film 26, the stacked film 6 (the insulator film 14) constituted by the silicon oxide film, the silicon nitride film and the silicon oxide film respectively having the thicknesses of 5 nm, 8 nm and 5 nm is accumulated. Here, in the select transistor forming region, the etching is executed using the resist pattern having a connection hole pattern for forming the plugs 15a and 15b in FIG. 9 as a mask, and a part of the stacked film 6 is removed. Accordingly, as shown in FIG. 9, connection hole connected to the gate electrodes 13a to 13d can be formed. Thereafter, a cap film 10 constituted by the n-type polysilicon film 7, the tungsten film 8 and the silicon nitride film for forming a dummy pattern is accumulated (FIG. 20).

Figure 21:
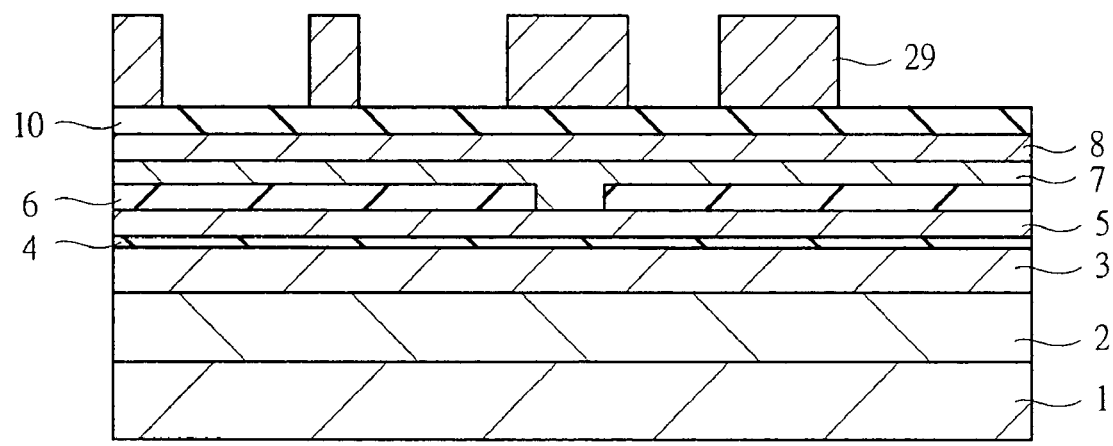
FIG. 21 is a cross sectional view of the main portion in the word line cross sectional direction for explaining the manufacturing step of the memory cell array coming next to FIG. 20.

From here, a description of a word line forming step will be given, therefore, cross sectional views in the word line cross sectional direction are referred. After accumulating the polysilicon 29, the resist pattern is formed at the minimum pitch (2F) by the photolithography technique. Further, an oxygen plasma ashing is applied to the resist film, thereby narrowing the line width. The line width is set to about one quarter of the pitch, that is, about F/2. Further, the etching of the polysilicon film 29 is executed using the resist film as a mask (FIG. 21).

Figure 22:
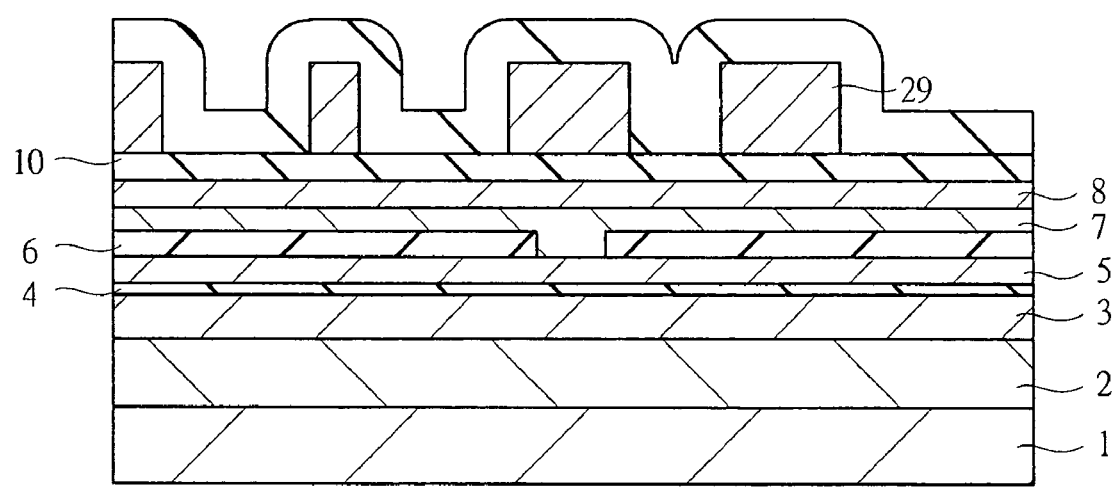
FIG. 22 is a cross sectional view of the main portion in the word line cross sectional direction for explaining the manufacturing step of the memory cell array coming next to FIG. 21.
Figure 23:
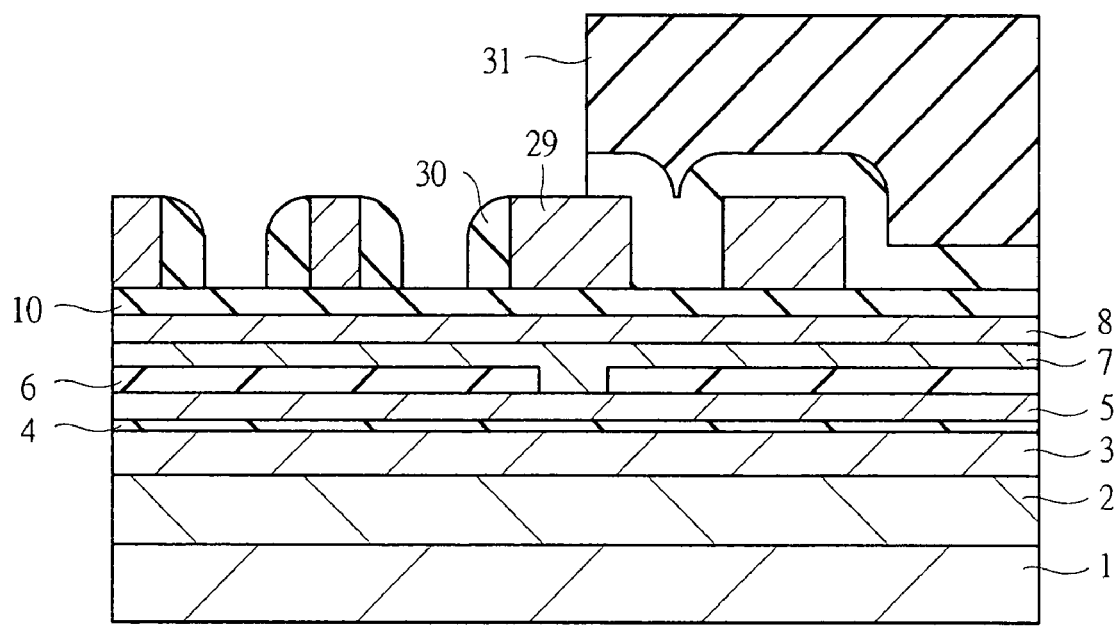
FIG. 23 is a cross sectional view of the main portion in the word line cross sectional direction for explaining the manufacturing step of the memory cell array coming next to FIG. 22.
Figure 24:
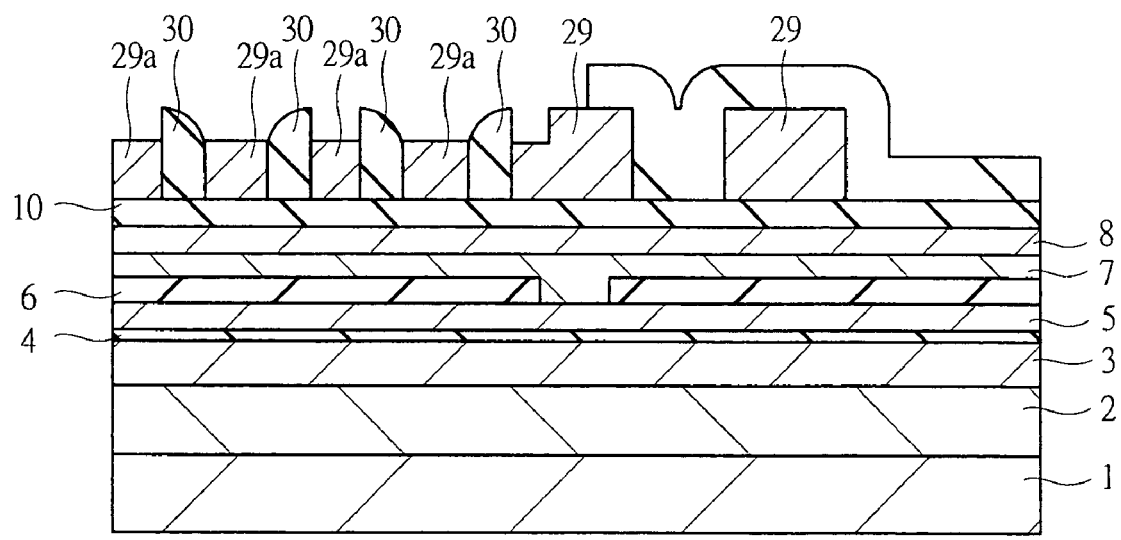
FIG. 24 is a cross sectional view of the main portion in the word line cross sectional direction for explaining the manufacturing step of the memory cell array coming next to FIG. 23.

Next, the silicon oxide film is accumulated using the CVD method (FIG. 22). Further, a side wall 30 constituted by the silicon oxide film is formed by executing the etching back with the select transistor forming region covered by the resist film 31 (FIG. 23). Subsequently, the pattern at the pitch F constituted by the polysilicon film 29a can be formed by removing the resist film 31, thereafter accumulating the polysilicon film, and etching back (FIG. 24).

Figure 25:
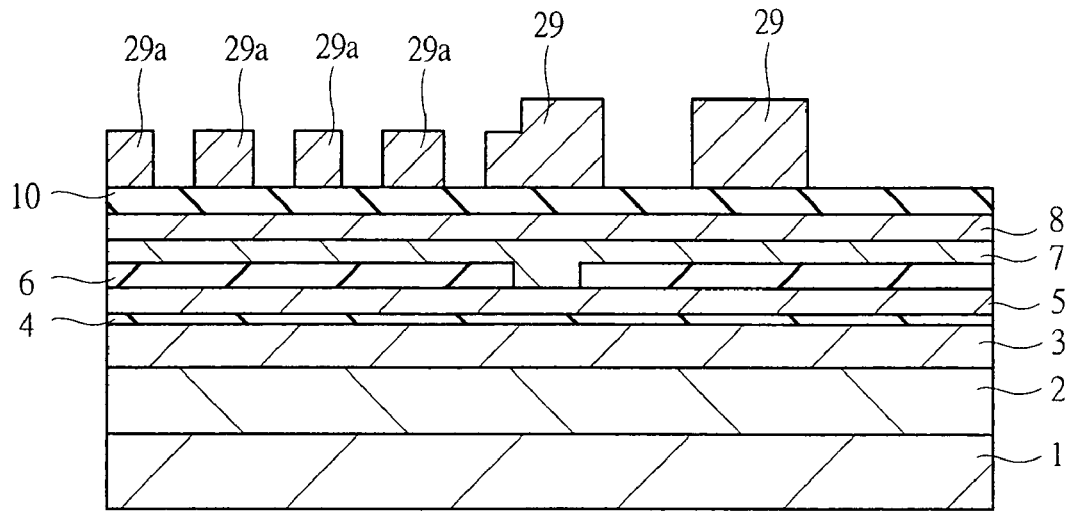
FIG. 25 is a cross sectional view of the main portion in the word line cross sectional direction for explaining the manufacturing step of the memory cell array coming next to FIG. 24.
Figure 26:
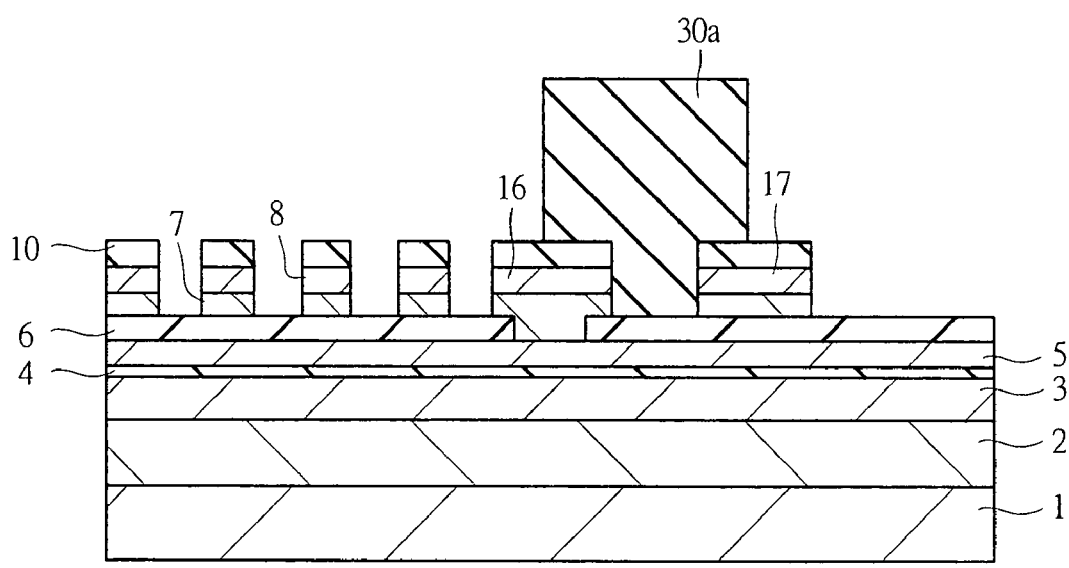
FIG. 26 is a cross sectional view of the main portion in the word line cross sectional direction for explaining the manufacturing step of the memory cell array coming next to FIG. 25.

Here, the pattern constituted by the polysilicon film 29 formed in the select transistor region is a thicker pattern. Thereafter, the side wall 30 constituted by the silicon oxide film is removed by wet etching (FIG. 25). At this time, an etching rest of the polysilicon film which is slightly left in the select transistor forming region is lifted off. In the memory region, the cap film 10 is etched using the formed polysilicon film 29a as a mask, and the tungsten film 8 and the polysilicon film 7 are etched. In the same manner, in the select transistor forming region, the cap 10, the tungsten film 8 and the polysilicon film 7 are etched using the formed polysilicon film 29 as a mask. Accordingly, the word line (the control electrode)

constituted by the tungsten film 8 and the polysilicon film 7 is formed in the memory region, and the select lines 16 and 17 constituted by the tungsten film 8 and the polysilicon film 7 are formed in the select transistor forming region (FIG. 26). Here, since the last etching is the silicon etching, the polysilicon films 29 and 29a in the top layer are lost, however, the pattern of the cap film 10 constituted by the silicon nitrogen film acts as the etching mask.

Figure 27:
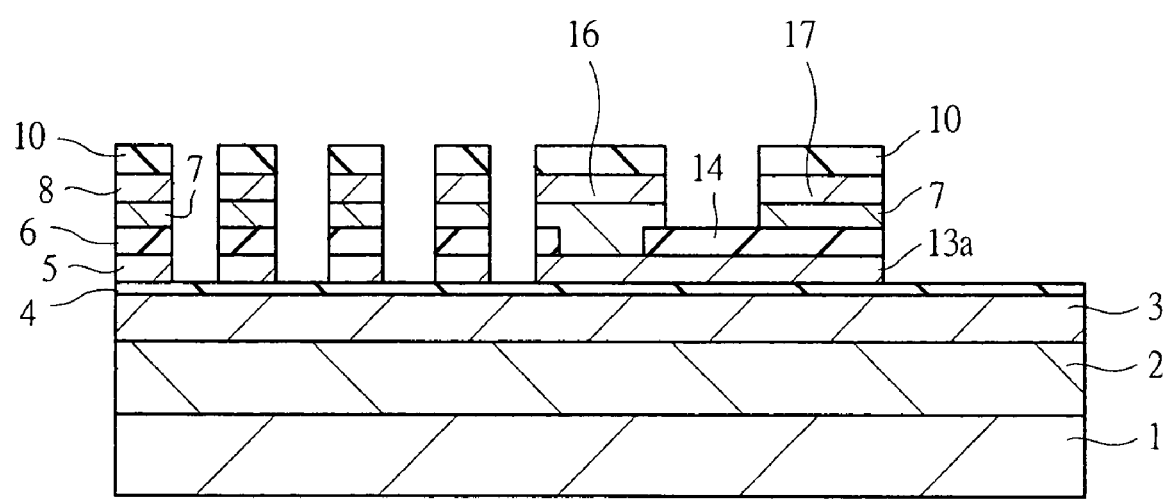
FIG. 27 is a cross sectional view of the main portion in the word line cross sectional direction for explaining the manufacturing step of the memory cell array coming next to FIG. 26.

Next, the resist pattern 30a covering between two select lines 16 and 17 formed in the select transistor region is formed (FIG. 26), and the stacked film 6 (the insulator film 14) and the polysilicon film (the charge accumulation film 5) are etched (FIG. 27). As a result, in the select transistor forming region, the polysilicon film is connected only between two select lines 16 and 17, and the gate electrode 13a of the select transistor is formed. On the other hand, in the memory region, the polysilicon film is divided per the individual memory cells, and the charge accumulation film 5 is formed. Thereafter, a contact step and a wiring step are executed.

In the present embodiment 1, the floating gate electrode constituted by the polysilicon film is used as the charge accumulation film 5, however, a plurality of small crystals (nano dot) provided by the other semiconductor such as a silicon (Si) or the like and a metal can be used as the charge accumulation region, and the charge accumulation film can be structured by the insulator film having the trap such as the silicon nitride film, the alumina film or the like.

If the isolated small grains (nano dot) are used, memory nodes are insulated from each other, therefore, it is not necessary to cut off by the patterning like the memory node of the conventional flash memory, as a result, it is easy to pattern, and a process margin is increased. Further, the patterning easiness like this can be obtained even by using the insulator film having the trap such as the silicon nitride film.

The silicon nitride film can execute the etching having the select ratio with respect to the silicon oxide film, and is excellent in the patterning performance in comparison with the charge accumulation region constituted by the small grains. On the other hand, since it is possible to surround the periphery of the charge accumulation region constituted by the small grains by the other insulator material having no trap such as the silicon oxide film, it is possible to select a material in which a charge movement between the small grains is generally hard to be generated, and an excellent retaining characteristic can be obtained.

Accordingly, this structure is suitable for a multi-valued memory having a small margin of a threshold voltage Vth. Therefore, this structure is preferable for application in which a plurality of information is stored by the injection amount of charge and suppression of characteristic fluctuation is required, such as the embodiment 1. In the case of employing the structure mentioned above, the charge accumulation film (the floating gate electrode) 5 and the gate electrode 13a of the select transistor are not made of the same material, such as the present embodiment 1. However, since the problem in the voltage applied area of the local data line including the select transistor exists in the same manner, the problem can be solved by applying the constructing method of the select transistor mentioned above in the same manner. Note that, all the description concerning the structure of the charge accumulation film can be applied to the other embodiments in the same manner.

Further, in the present embodiment 1, as known from the manufacturing step, the technique of making the pitch of the local data line half is employed, however, even in the case which does not employ the technique mentioned above, the voltage applying method mentioned above is effective. Generally, an ultra resolution (phase shift) of an isolated pattern (plug) is difficult, however, the ultra resolution (the phase shift) can be used in the repeat pattern effectively. Accordingly, there is a concern that, in accordance with an advance of the reduction of memory cell size, even if the pattern of the local data line can be patterned finely, the contact hole becomes relatively larger. In the case mentioned above, the high-density memory cell array can be achieved using the present embodiment 1 and the invention explained in the other embodiment. Further, it is extremely hard to advance the aligning technique of the photolithography with respect to the progress of the reduction of memory cell size. Therefore, even in the case that a relatively great alignment margin is required with respect to the reduction of memory cell size, the present invention is effective.

Embodiment 2

A description of a memory cell array of a nonvolatile semiconductor memory device in accordance with an embodiment 2 of the present invention will be given with reference to FIG. 28 and FIG. 29. A memory cell structure and an operation principle of the present embodiment 2 are the same as those of the memory cell in accordance with the embodiment 1, however, a different point from the embodiment 1 exists in a connection relation between the local data line and the global data line.

Figure 28:
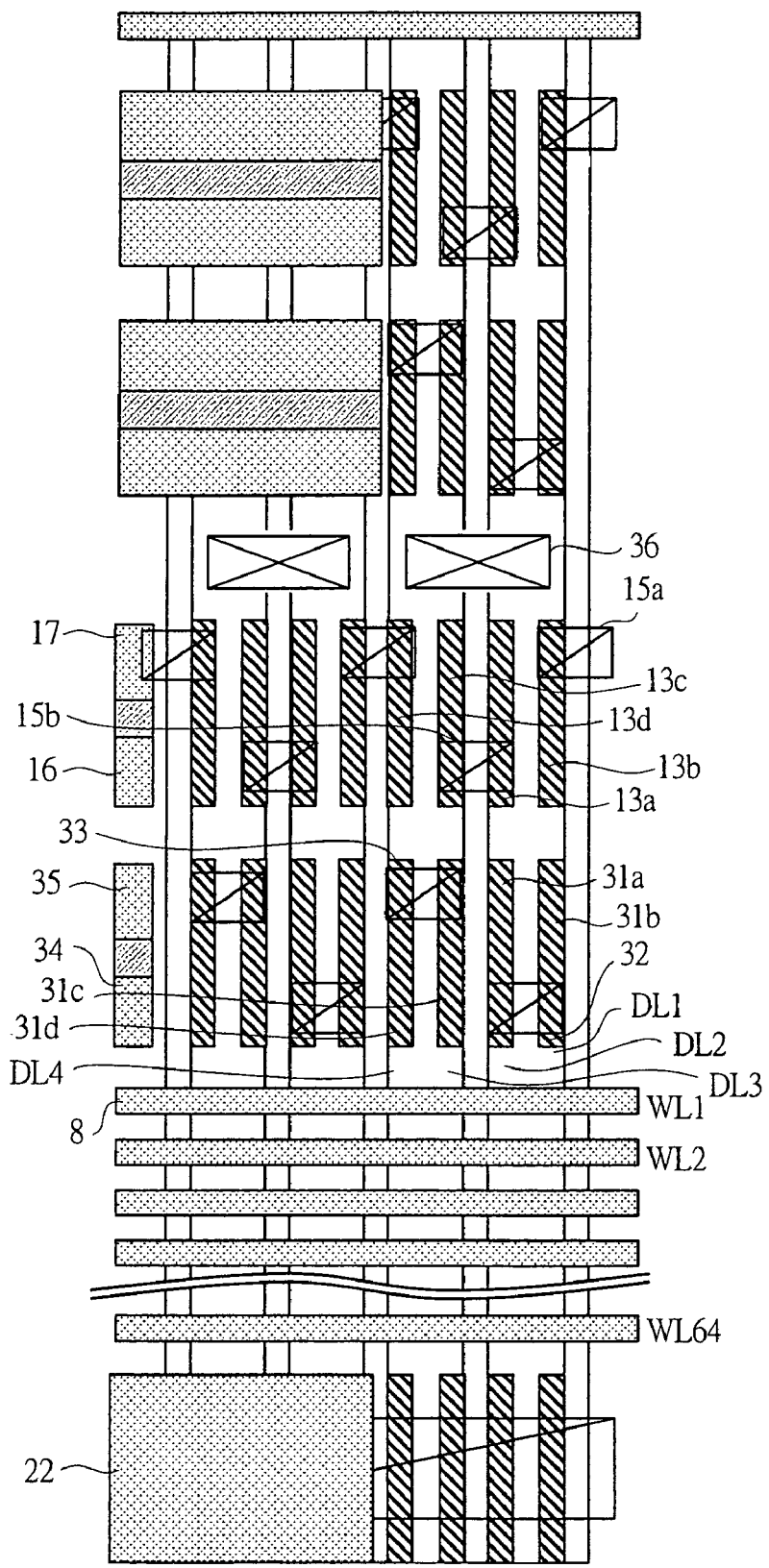
FIG. 28 is a plan view of a main portion of a memory cell array in accordance with an embodiment 2.
Figure 29:
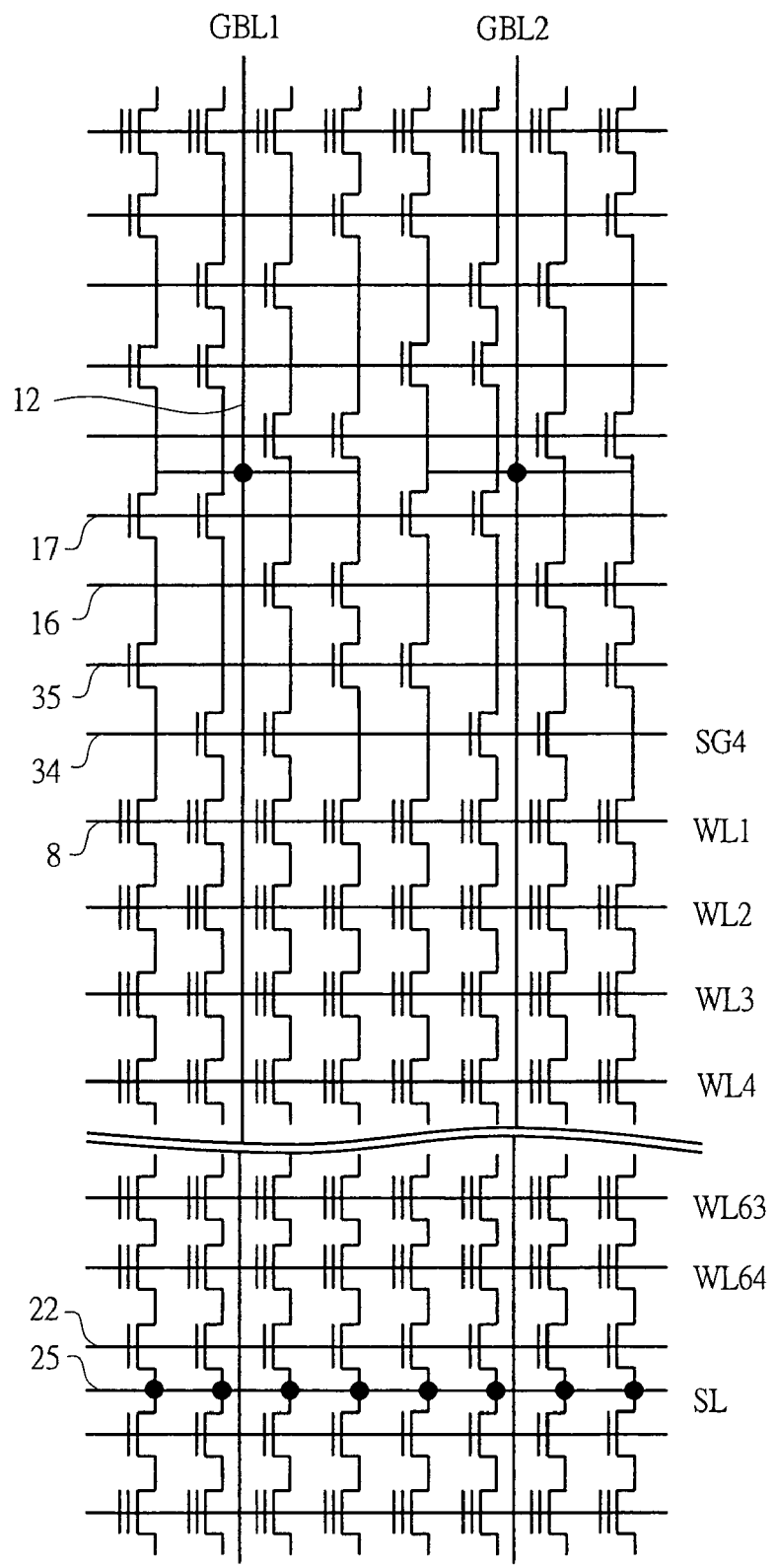
FIG. 29 is an equivalent circuit diagram of the memory cell array in accordance with the embodiment 2.

FIG. 28 is a plan view corresponding to FIG. 9 of the embodiment 1. FIG. 29 is an equivalent circuit diagram corresponding to FIG. 28. In the embodiment 1, two local data lines are connected to one global data line via the select transistor, however, in the present embodiment 2, there is a difference that four local data lines are connected to one global data line. By employing the structure mentioned above, it is possible to have a margin of the contact itself with respect to the local data line and an aligning precision thereof, therefore, a higher yield ratio can be expected. Further, since it is not necessary to pattern the global data line at the minimum pattering dimension, the patterning can be easily executed, and there is a feature that the coupling between the adjacent global data lines becomes smaller.

In order to electrically select only one local data line from four local data lines connected to the global data line via the plug 36, it is necessary that two gate electrodes 13 and 31 are provided on one local data line. In other words, in the embodiment 1 mentioned above, as shown in FIG. 9, one gate electrode 13a is provided between the memory cell and the plug 20 in the local data line DL2. On the contrary, in the present embodiment 2, as shown in FIG. 28, the gate electrode 13a and the gate electrode 31a are provided between the memory cell and the plug 36, in the local data line DL2.

The select line 16 and the select line 17 are provided on the adjacent gate electrodes 13a to 13d. Further, the select line 17 is connected to the gate electrodes 13b and 13d via the plug 15a, and the select line 16 is connected to the gate electrodes 13a and 13c via the plug 15b. In the same manner, a select line 34 and a select line 35 are provided on the adjacent gate electrodes 31a to 31d. The select line 34 is connected to the gate electrodes 31a and 31b via a plug 32, and the select line 35 is connected to the gate electrodes 31c and 31d via a plug 33.

For example, in the case where a local bit line DL3 is selected, it is preferable to select the select line 16 and the select line 35 as well as selecting the global data line connected to a plug 36, and unselect the select line 17 and the select line 34. As mentioned above, it is possible to electrically select only one local data line DL3 from four local data lines DL1 to DL4 connected to the global data line via the plug 36.

In the case of connecting four local data lines to one global data line, four stages of gate electrodes are used in the prior art, however, since a gate length is large in this case, a very large area penalty is generated. In the present embodiment 2, since the structure is achieved by two stages of gate electrodes (for example, the gate electrode 13a and the gate electrode 31a), the select transistor can be structured in a small area. Accordingly, it is possible to minimize the area penalty at setting of the select transistor. This structure can be achieved, for example, by setting two select lines 16 and 17 on gate electrodes 13a to 13d of one stage, and setting two select lines 34 and 35 on gate electrodes 31a to 31d of one stage.

Embodiment 3

Figure 30:
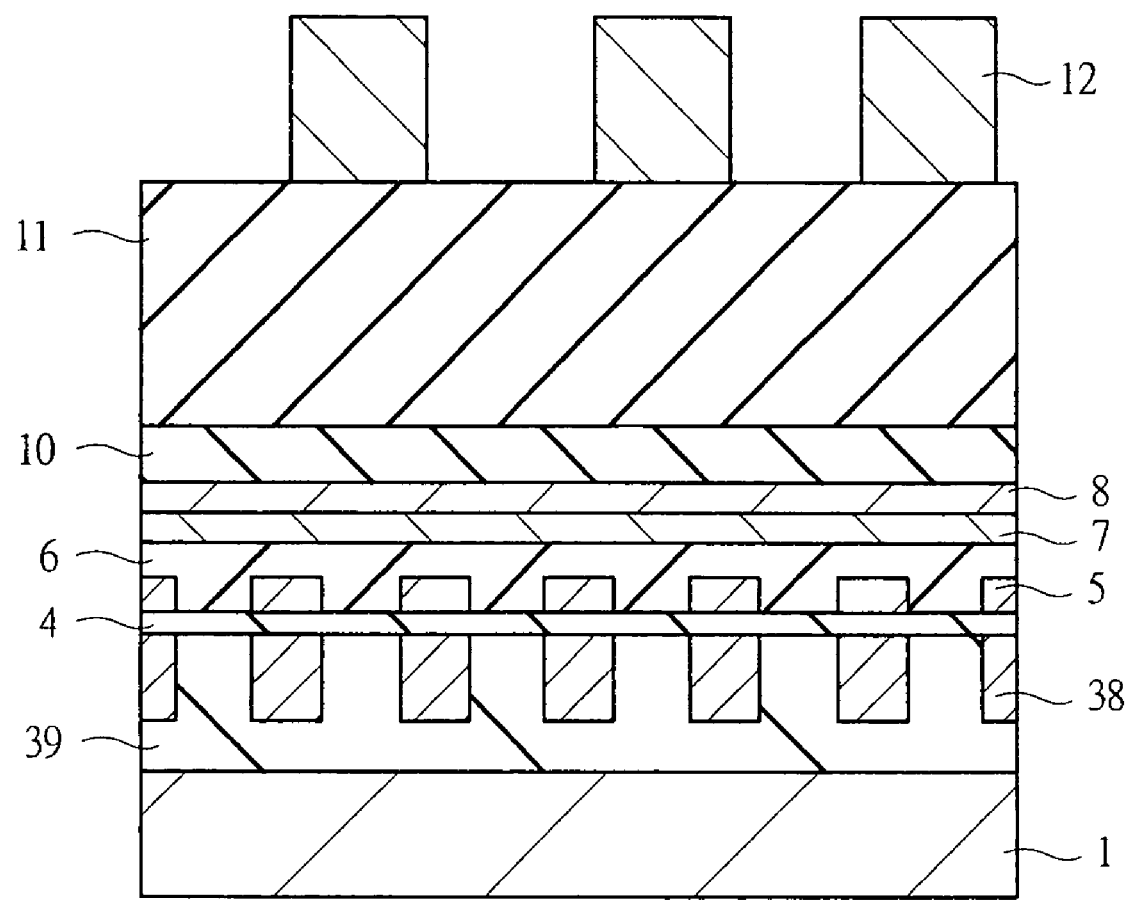
FIG. 30 is a cross sectional view of a main portion of a memory cell array in accordance with an embodiment 3.

A cross sectional view in a data line cross sectional direction of a memory region of a nonvolatile semiconductor memory device in accordance with an embodiment 3 of the present invention is shown in FIG. 30. A difference between the present embodiment 3 and the embodiment 1 mentioned above exists only in a structure of the isolation region, and the other portions such as the equivalent circuit, the operation and the like are similar.

In FIG. 30, a local data line 38 is formed as a narrow line shape, and is insulated from the silicon substrate 1 in a lower portion thereof. An isolation region 39 insulates not only a side surface of the local data line 38 but also a lower surface thereof. Accordingly, there is a feature that a leak pass between the local data lines 38 does not exist, and a depth of the isolation region 39 should not be so large. In the present embodiment 3, it is possible to make an interval between the local data lines 38 small. As a result, if the groove-shaped isolation region having the same depth as the conventional one is provided, an aspect ratio becomes higher, and it becomes hard to achieve both the groove formation by the etching, and the embedding by the insulator film. In the present embodiment 3, this problem is solved.

Since a different step of the present embodiment 3 from the embodiment 1 is only an isolation region forming step, a description of the difference only will given. First, a shallower groove than the embodiment 1 is formed in a self-aligned silicon substrate 1 etching step (refer to FIG. 18) which is similar to the embodiment 1. A depth thereof is set to 60 nm. Thereafter, a surface of the groove is oxidized at about 6 nm, and only a silicon oxide film of the groove bottom portion is removed by an anisotropic dry etching. Thereafter, by executing an isotropic silicon etching, the silicon is scraped only in the groove bottom portion, and the groove bottom portion is connected to the groove bottom portion of the adjacent local data line. As a result, a narrow line shaped local data line 38 is formed. Note that, since the select transistor forming region (the voltage applied area) is structured such as to be wider than the pitch F, the silicon substrate and the local data line are kept connected in this portion, and the narrow line shaped local data line is supported. Thereafter, the isolation region 39 can be formed by embedding the silicon oxide film in the groove formed in such a manner as to surround the periphery of the local data line.

Figure 31:
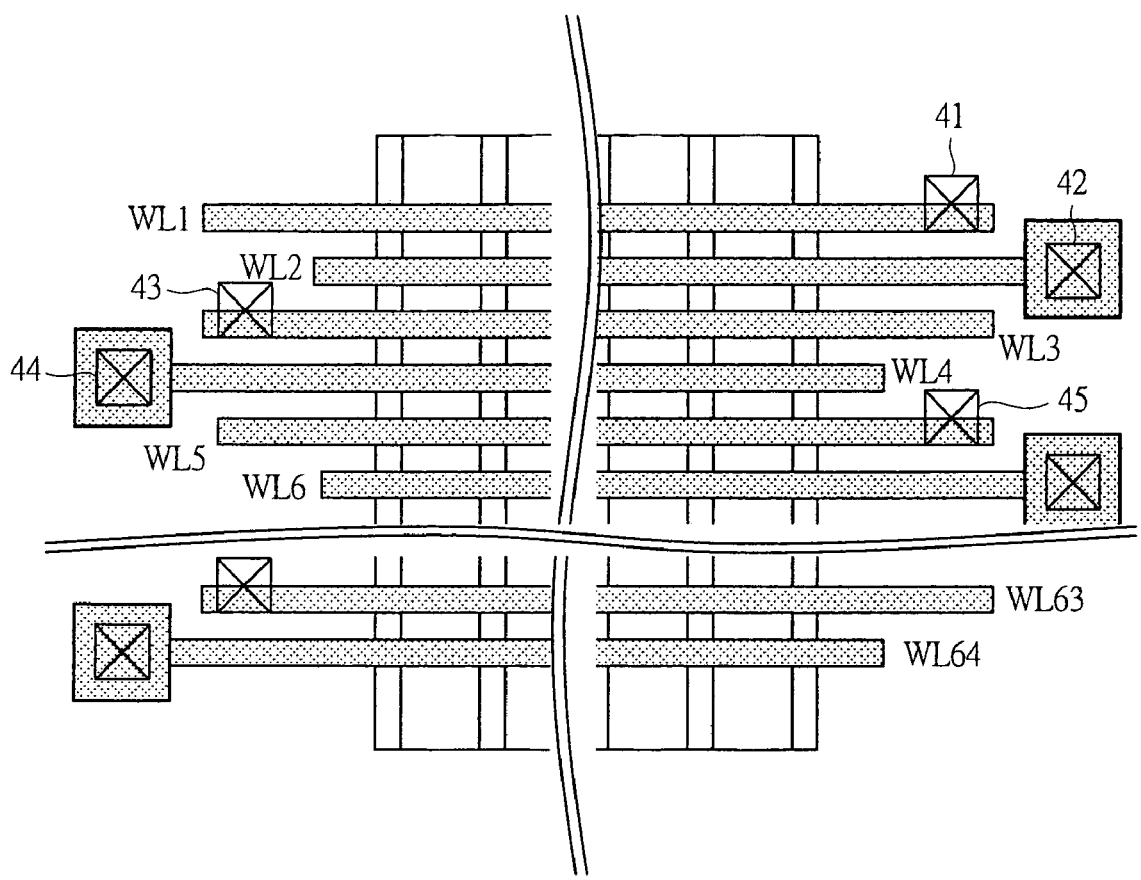
FIG. 31 is a plan view of a main portion for explaining a plug formation with respect to a word line of a memory cell array.

Next, a description of a method of forming the plug with respect to the word line in the embodiment 1 to the embodiment 3 will be given with reference to FIG. 31. In order to simplify the description, the select transistor and the like are omitted, and both ends of the word line of the memory cell array are illustrated. The forming method of the plug is in common with the other embodiments. The structure is made such that four word lines (for example, WL1, WL2, WL3 and WL4 in FIG. 31) are set to one set, and the plug is formed from both ends. The structure mentioned above is repeated. Viewing in one side (a right side), there exist a protruding word line WL2, a short word line WL4, and middle word lines WL1 and WL3. With respect to the protruding word line WL2, it is easy to arrange a plug 42. A plug 41 is formed in one side of only the word line WL1, which is one of the middle word lines WL1 and WL3, note that, there is a feature that the plug 41 is formed, as shown in FIG. 31, such that a center of the plug 41 is deviated from a center of the word line WL1. In this layout, the plug 41 does not come into collision with the adjacent word line WL2 even if the alignment deviation is generated in the plug 41. In the case that the alignment deviation of the plug 41 is generated in an upward direction, an overlap area with the word line WL1 becomes small, so that there is a concern that the contact resistance becomes higher. However, since the hole of the plug 41 is dug to such a degree as to reach the isolation region of a ground, a sufficient contact area is secured in a side surface of the word line WL1. Further, it is possible to avoid the contact with the plug 45 of the adjacent word line WL5 by setting the short word line WL4. Plugs 43 and 44 are formed by employing the same layout in an opposite side (a left side) with respect to the next two word lines WL3 and WL4. By applying voltage in both sides, a wiring density comes to a pitch 2F in one side, and it is possible to achieve the wiring for applying voltage by the metal wiring of the same layer. As mentioned above, the plug with respect to the word line can be provided.

Figure 32:
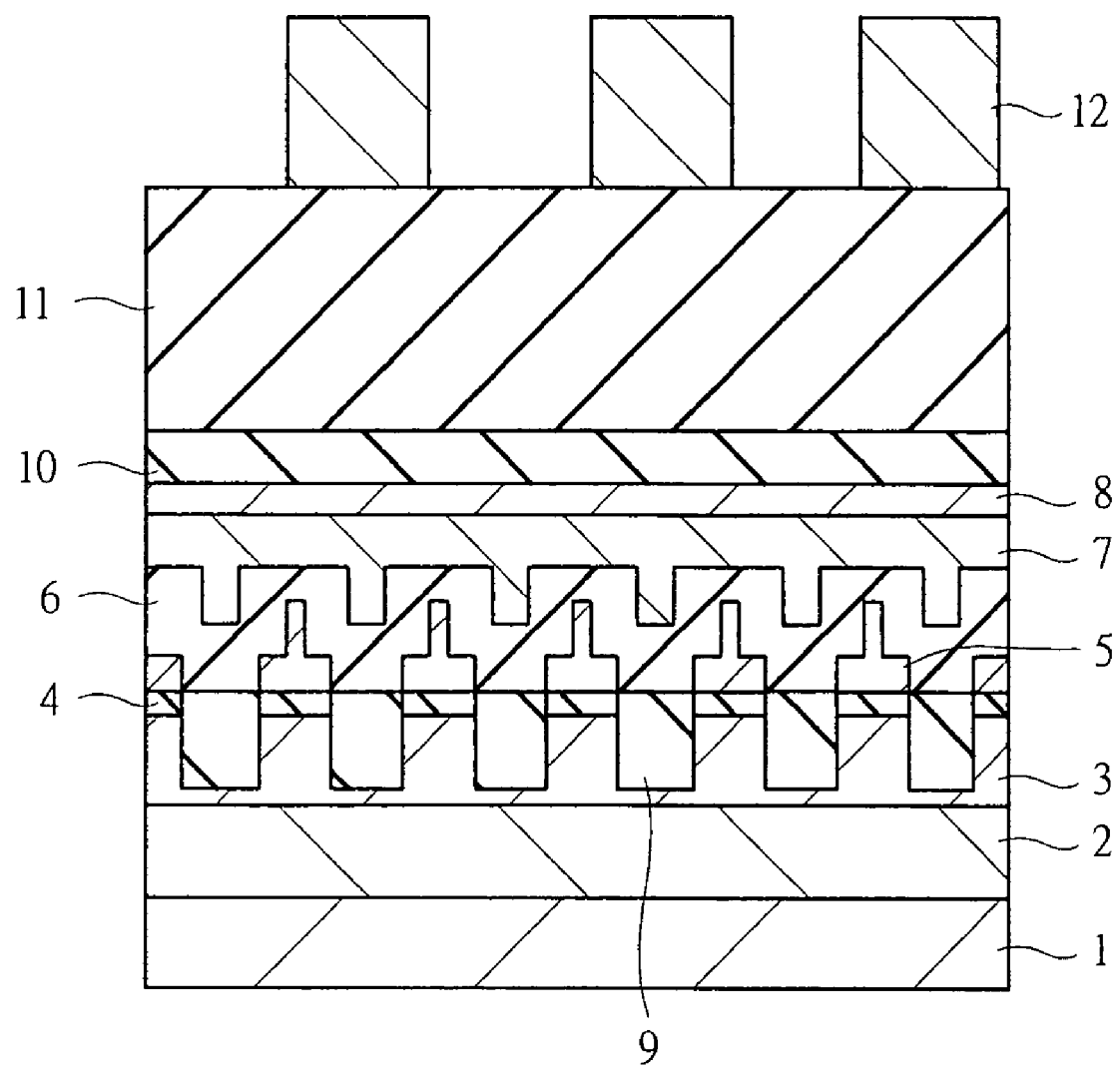
FIG. 32 is a cross sectional view of a main portion showing a modified example of the memory cell array.

Further, in the embodiment 1 to the embodiment 3, the flat type floating gate structure which can be patterned easily is employed as the charge accumulation film 5, however, a three-dimensional floating gate structure as shown in FIG. 32 can be used as the charge accumulation film 5. An electrostatic capacity between the word line (the polysilicon film 7 and the tungsten film 8) and the charge accumulation film (the floating gate electrode) 5 is increased, and it becomes possible to take the charge in and out more efficiently. Further, as a method of achieving a high efficiency by the flat structure, it is effective to use a film having a higher dielectric constant than the silicon oxide film, for example, an alumina film, for the stacked film 6. Further, it is effective to use a film having a lower barrier than the silicon oxide film, for example, a hafnium oxide ($HfO_2$) film, for the gate insulator film 4. Further, it is effective to use a high-efficient tunnel film in which the tunnel current is largely changed at a applying an electric field, for example, a three-layer stacked film having low, high and low barrier heights. It is possible to achieve a sufficiently efficient operation even in the flat structure by using any one of the stacked film having the high-dielectric constant, and the high-efficient gate insulator film or a combination thereof.

As mentioned above, the description of the inventions carried out by the inventors of the present invention is given specifically on the basis of the embodiments, however, it goes without saying that the present invention is not limited to the embodiments mentioned above, but can be variously modified within the scope of the invention.

In the above description, the description is given of the case that the invention carried out by the inventors is applied to the flash memory lone corresponding to the background thereof. However, the present invention is not limited to this, but can be applied, for example, to a semiconductor device of EEPROM substance lone, and a semiconductor device mounting a memory in a mixed manner such as a system large scale integrated circuit (LSI) having the EEPROM or the flash memory.

The present invention can be widely utilized for a manufacturing industry of the nonvolatile semiconductor memory device having the nonvolatile memory cell such as the flash memory or the like.

What is claimed is:

1. A semiconductor memory device comprising:
   (a) a local data line formed along a first direction;
   (b) a global data line formed over an upper surface of the local data line, the global data line being formed along the first direction;
   (c) a word line formed along a second direction perpendicular to the first direction; and
   (d) a charge accumulation portion formed in an intersecting region at which the local data line and the word line intersect in plan view,
   wherein the semiconductor memory device stores information based on change of an electric current flowing through the local data line corresponding to a charge accumulated in the charge accumulation portion,
   wherein the semiconductor memory device includes at least two of said local data lines, each being electrically connected to said global data line,
   wherein said global data line and a first local data line of said at least two local data lines are connected by a first select transistor, and said global data line and a second local data line of said at least two local data lines are connected by a second select transistor,
   wherein the first select transistor includes:
   (e1) a first gate electrode layer formed over an upper surface of the first local data line;
   (e2) a first portion of a first select line formed along the second direction over a first upper surface portion of the first gate electrode layer; and
   (e3) a first portion of a second select line formed along the second direction over a second upper surface portion of the first gate electrode layer,
   wherein the second select transistor includes:
   (f1) a second gate electrode layer formed over an upper surface of the second local data line;
   (f2) a second portion of the first select line formed along the second direction over a first upper surface portion of the second gate electrode layer; and
   (f3) a second portion of the second select line formed along the second direction over a second upper surface portion of the second gate electrode layer,
   wherein the first select line is connected to the first gate electrode layer and selects the first local data line, and
   wherein the second select line is connected to the second gate electrode layer and selects the second local data line.

2. The semiconductor memory device according to claim 1, wherein a width of the first gate electrode layer in the second direction is the same as a width of the first local data line in the second direction, and a width of the second gate electrode layer in the second direction is the same as a width of the second local data line in the second direction.

3. The semiconductor memory device according to claim 1, wherein respective widths of the first gate electrode layer and the second gate electrode layer in the first direction are greater than a width obtained by adding a width of the first select line in the first direction to a width of the second select line in the first direction.

4. The semiconductor memory device according to claim 1, wherein a pitch width of each of the at least two local data lines is less than a diameter of a plug connecting the at least two local data lines and the global data line.

5. The semiconductor memory device according to claim 1, wherein a pitch width of the word line is less than a diameter of a plug connecting the at least two local data lines and the global data line.

6. The semiconductor memory device according to claim 1, further including a plurality of said global data lines, wherein a program operation is executed using alternating global data lines of said plurality.

7. A semiconductor memory device according to claim 1, further including a plurality of said global data lines, wherein a read operation is executed using alternating global data lines of said plurality.

8. The semiconductor memory device according to claim 1, wherein a lower surface of each said local data line is insulated from the semiconductor substrate at the intersecting region.

9. A semiconductor memory device comprising:
   (a) a local data line formed along a first direction;
   (b) a global data line formed over an upper surface of the local data line, the global data line being formed along the first direction;
   (c) a word line formed along a second direction perpendicular to the first direction; and
   (d) a charge accumulation portion formed in an intersecting region at which the local data line and the word line intersect in plan view,
   wherein the semiconductor memory device stores information based on change of an electric current flowing through the local data line corresponding to a charge accumulated in the charge accumulation portion,
   wherein the semiconductor memory device includes a plurality of said local data lines and at least two of said global data lines,
   wherein a first global data line of said at least two global data lines and a first local data line of said plurality are connected by a first select transistor,
   wherein the first global data line and a second local data line of said plurality are connected by a second select transistor,
   wherein a second global data line of said at least two global data lines adjacent to the first global data line and a third local data line of said plurality are connected by a third select transistor,
   wherein the second global data line and a fourth local data line of said plurality are connected by a fourth select transistor,
   wherein the first select transistor comprises:
   (g1) a first gate electrode layer formed over an upper surface of the first local data line;
   (g2) a first portion of a first select line formed along the second direction over a first upper surface portion of the first gate electrode layer; and
   (g3) a first portion of a second select line formed along the second direction over a second upper surface portion of the first gate electrode layer,
   wherein the second select transistor comprises:
   (h1) a second gate electrode layer formed over an upper surface of the second local data line;
   (h2) a second portion of the first select line formed along the second direction over a first upper surface portion of the second gate electrode layer; and
   (h3) a second portion of the second select line formed along the second direction over a second upper surface portion of the second gate electrode layer, wherein the third select transistor comprises:

(i1) a third gate electrode layer formed over an upper surface of the third local data line;

(i2) a third portion of the first select line formed along the second direction over a first upper surface portion of the third gate electrode layer; and (i3) a third portion of the second select line formed along the second direction over a second upper surface portion of the third gate electrode layer, wherein the fourth select transistor comprises:

(j1) a fourth gate electrode layer formed over an upper surface of the fourth local data line;

(j2) a first portion of the first select line formed along the second direction over a first upper surface portion of the fourth gate electrode layer; and (j3) a second portion of the second select line formed along the second direction over a second upper surface portion of the fourth gate electrode layer, wherein the first select line is connected to the first gate electrode, wherein the first select line is connected to the fourth gate electrode, wherein the second select line is connected to the second gate electrode, and wherein the second select line is connected to the third gate electrode.

10. The semiconductor memory device according to claim 9, wherein a plug connecting the second select line and the second gate electrode layer is integrally formed with a plug connecting the second select line and the third gate electrode layer.

* * * * *